(12) United States Patent
Sakata

(10) Patent No.: US 6,828,589 B2
(45) Date of Patent: Dec. 7, 2004

(54) OPTICAL SEMICONDUCTOR DEVICE AND METHOD FOR MANUFACTURING THE SAME

(75) Inventor: Yasutaka Sakata, Tokyo (JP)

(73) Assignee: NEC Compound Conductor Devices, Ltd., Kawasaki (JP)

( * ) Notice: Subject to any disclaimer, the term of this patent is extended or adjusted under 35 U.S.C. 154(b) by 0 days.

(21) Appl. No.: 10/372,278

(22) Filed: Feb. 25, 2003

(65) Prior Publication Data

US 2003/0160249 A1 Aug. 28, 2003

Related U.S. Application Data

(62) Division of application No. 09/790,651, filed on Feb. 23, 2001, now abandoned.

(30) Foreign Application Priority Data

Feb. 25, 2000 (JP) .................................. P2000-050248

(51) Int. Cl.[7] .......................................... H01L 27/15
(52) U.S. Cl. .............................. 257/79; 257/80; 257/81; 257/82; 257/84; 257/85; 257/88; 257/93; 257/96; 257/98; 257/103
(58) Field of Search ............................ 257/79–103

(56) References Cited

U.S. PATENT DOCUMENTS 4,791,647 A 12/1988 Sugou
5,093,835 A 3/1992 Takemoto et al.
5,479,544 A 12/1995 Ono et al.
5,561,682 A 10/1996 Aoki et al.
5,668,900 A 9/1997 Little et al.
5,770,466 A 6/1998 Sasaki et al.
5,953,359 A * 9/1999 Yamaguchi et al. ........... 372/50
5,960,023 A * 9/1999 Takahashi .................... 372/96
5,982,804 A 11/1999 Chen et al.
6,376,338 B2 4/2002 Ekawa et al.
6,541,297 B2 * 4/2003 Takahashi .................... 438/31

FOREIGN PATENT DOCUMENTS

| EP | 0 836 255 A1 | 10/1997 |
| EP | 0 952 470 A2 | 4/1999 |
| JP | 05-110187 | 4/1993 |
| JP | 10-117040 | 6/1998 |

OTHER PUBLICATIONS

Agrawal, G.P. and Dutta, N.K., "Long–wavelength semiconductor lasers", 1994, Van Nostrand Reinhold, USA.

* cited by examiner

Primary Examiner—Long Pham
Assistant Examiner—Wai-Sing Louie
(74) Attorney, Agent, or Firm—McGinn & Gibb, PLLC

(57) ABSTRACT

An optical semiconductor device comprising a plurality of semiconductor lasers formed on a single substrate is provided, in which each of said semiconductor lasers emits a laser lights having designed different oscillating wavelength. This optical semiconductor device is provided by maintaining the coupling coefficient of each of said semiconductor lasers at a constant value by adjusting the composition of an optical guide layer or the mask width for the MOVPE growth.

19 Claims, 26 Drawing Sheets

Fig. 1
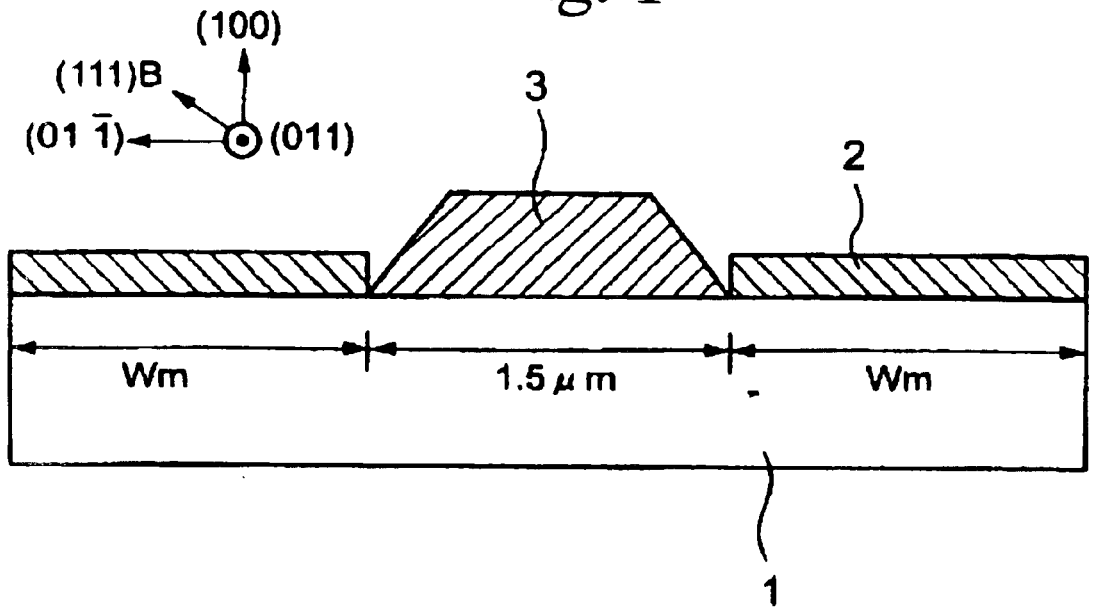
Fig. 2
WAVEGUIDE AXIS DIRECTION
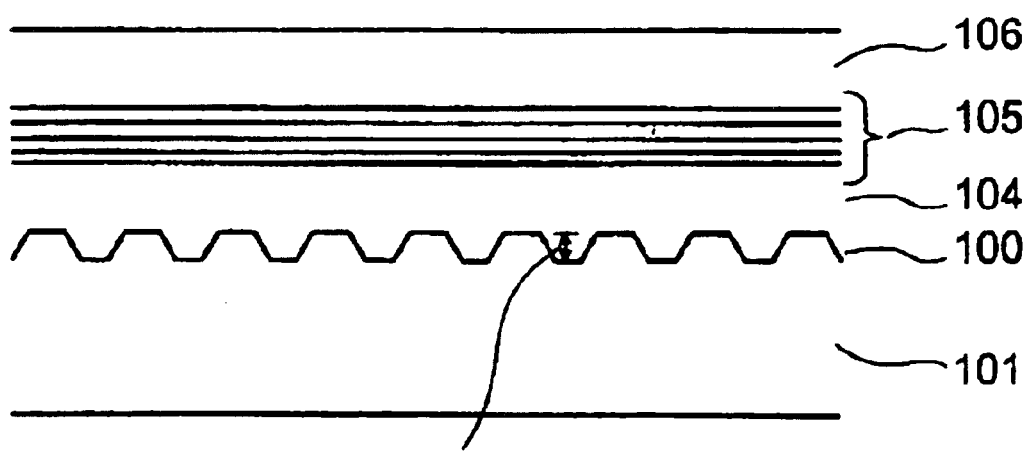
DIFFRACTION GRATING HEIGHT $d_{GTG}$ DFB OSCILLATION WAVELENGTH [μm]

DFB OSCILLATION WAVELENGTH [μm]

DFB OSCILLATION WAVELENGTH [μm]

OPTICAL SEMICONDUCTOR DEVICE AND METHOD FOR MANUFACTURING THE SAME

This Application is a Divisional Application of U.S. patent application Ser. No. 09/790,651, filed on Feb. 23, 2001 ABN.

BACKGROUND OF THE INVENTION

1. Field of the Invention

The present invention relates to a method of manufacturing an optical semiconductor device, and in particular relates to a collective manufacturing method of the optical semiconductor device.

2. Background Art

In order to cope with an increasing demand for communication systems, an optical communication system based on the WDM (wavelength divisional multiplexing) system is being developed, because it is capable of expanding the channel capacity of the optical fiber by transmitting light signals having different wavelengths in one optical fiber without extending the manufacturing facility. It is a matter of course that this WDM optical communication system requires a light source, which emits a plurality of lights having multiple wavelengths. Thus, the problem in this WDM optical communication system is to provide a light source laser which can emit a plurality of lights having multiple wavelengths.

Japanese Unexamined Patent Application, First Publication No. Hei 10-117040 discloses a collective manufacturing method of a semiconductor device in which different wavelength DFB (distributed feedback) lasers and different wavelength EA (electro-absorption) modulator integrated DFB lasers are integrated on a semiconductor substrate. In the above Japanese patent application, a method is used for providing multiple oscillating frequencies on a single semiconductor substrate by first forming diffraction gratings having different cycles (pitches) A as shown in FIG. 46 by electron beam exposure and by an etching technique and by forming a multiple layered structure including active layers (light absorbing layers) having multiple band-gap wavelengths corresponding to the oscillation wavelengths by a selective MOVPE (metal-organic vapor phase epitaxy) growth method. In this method, since the oscillation wavelength can be made to coincide to some extent with the band-gap wavelength of the laser active layer, the threshold for the laser oscillation or the homogeneity of the oscillation efficiency can be maintained comparatively consistent.

However, when the active layers (and light absorbing layers) are produced by selective MOVPE growth, the band-gap wavelength of the light guide layer formed on the diffraction gratings and the thickness of the active layers change. When the band-gap wavelength of the light guide layer changes, the absolute value of the refractive index of the layers on the diffraction gratings changes, which results in changing the periodic change of the refractive index by the diffraction grating. When the thickness of the active layer changes, a light confinement factor in the active layer changes, which results in changing the light intensity of the diffraction grating region. The variation of the periodic change of the refractive index of the guide layer by the diffraction grating and the light intensity of the diffraction grating region are parameters related to a coupling coefficient κ, the coupling coefficient κ changes as the oscillation wavelength changes in the collective formation of the multiple wavelength laser in which variations occur in both of the periodic change and the light intensity change.

The technique disclosed in the above-described Japanese patent application is to broaden the mask width of a pair of stripe-like masks for the selective growth, in order to lengthen the oscillation wavelength. However, there are two factors affecting the coupling coefficient κ: (1) the absolute value of the refractive index of the light guide layer becomes large because the band-gap wavelength of the light guide layer on the diffraction grating increases to a longer wavelength; and (2) since the thickness of the active layer increases, the light confinement coefficient in the active region increases and as a result, the light intensity in the diffraction grating region decreases. The effect of the above item (1) has an action to increase the coupling coefficient κ and the effect of the above item (2) has an action to decrease the coupling coefficient κ, so that the relationship between the oscillation wavelength (or the selection growth mask width) and the coupling coefficient κ changes depending upon the ratio of the magnitudes of the above effects of (1) and (2).

The ratio of the magnitudes of the above effects (1) and (2) is dependent on the MOVPE apparatus for growing the crystal or the growth conditions. The coupling coefficient κ is a parameter related to the oscillation threshold value or the light emission efficiency of the DFB laser, the single longitudinal mode yield, or the long distance transmission characteristics. Thus, if the crystal is not grown homogeneously, the manufacturing yield of the elements is decreased.

There is a trade-off between the longitudinal single mode yield and the effect of the coupling coefficient κ on the long distance transmission characteristic, and the provision of the optimized homogeneous κ value is an important factor for obtaining a high final yield.

Therefore, the first problem is that the longitudinal single mode oscillation yield decreases as a result of the heterogeneity generated in the laser oscillation threshold currents and in the light emitting efficiencies at various wavelengths. This is caused due to the fact that the light emitting elements emitting lights with different wavelengths from each other have different coupling coefficients.

The second problem is that, when each laser light is transmitted for a long distance, the transmission characteristic yield for a laser light changes depending on the wavelength of the laser light. Since the coupling coefficient of each laser oscillating element changes, the wavelength variation (wavelength chirp) for each laser oscillating wavelength by residual reflection at each end surface changes for each laser element.

The object of the present invention is to suppress the dispersion of the coupling coefficients of the DFB laser portion, which is usually caused at the time of collective forming of the different wavelength DFB laser or the different wavelength EA modulator integrated DFB laser on a semiconductor substrate, and the object of the present invention further extends to homogenization of the laser oscillation threshold value, the light emitting efficiency, and the long distance transmission characteristics, and to the improvement of the longitudinal single mode oscillation yield.

The object of the present method for manufacturing the optical semiconductor device is to provide a method which is capable of solving the problems occurring in the conventional methods for collectively forming the different wavelength DFB laser. That is, the object of the present invention is to provide a method for manufacturing the different wavelength DFB laser or the different wavelength DFB laser integrated element, which is capable of maintaining the coupling coefficient κ at a constant value, even if the oscillating wavelength differs.

SUMMARY OF THE INVENTION

The present invention has been carried out to overcome the above-described problems and the following technical constitution has been obtained.

The present invention provides an optical semiconductor device comprising a plurality of semiconductor lasers formed on a single substrate, wherein-each of said semiconductor lasers emits laser lights having oscillating wavelengths differing from each other by different cycles of a plurality of diffraction gratings, wherein the composition of an optical guide layer in contact with one of said diffraction gratings is determined such that the coupling coefficient of each of said semiconductor lasers is maintained at a constant value.

The present invention also provides an optical semiconductor device comprising a plurality of semiconductor lasers formed on a single substrate, wherein each of said plurality of semiconductor lasers emits longitudinal single mode laser lights having different oscillating wavelengths due to a distributed feedback operation of a periodic change of the refractive index in the semiconductor lasers, and wherein each of said plurality of semiconductor lasers have the same coupling coefficient by being provided with a diffraction grating embedded semiconductor layer each having a refractive index corresponding to the oscillating wavelength.

In the above optical semiconductor device, each of said plurality of semiconductor lasers comprises a diffraction grating embedded semiconductor layer made of InGaAsP having a band-gap wavelength (energy) corresponding to the oscillating wavelength thereof, and each of said semiconductor lasers is a distributed feedback semiconductor laser.

In the above optical semiconductor device, an optical modulator is monolithically integrated with said semiconductor laser.

In the above optical semiconductor device comprising a plurality of semiconductor lasers comprising an InGaAsP guide layer formed on or below said diffraction gratings, a multi-quantum well layer, and an InP clad layer on an InP substrate, and which emit laser lights having different wavelengths determined by the cycle of said diffraction gratings, the refractive index of said guide layer is adjusted so as to equalize the coupling coefficients of the respective semiconductor lasers.

The present invention also provides a manufacturing method for collectively manufacturing, on a single substrate, an optical semiconductor device comprising a plurality of semiconductor lasers which emit longitudinal single mode laser lights having different wavelengths due to a distribution feedback operation of a periodic change of the refractive index in respective semiconductor lasers, wherein the refractive indexes of said diffraction grating embedded semiconductor layer are decreased (or increased) so as to cancel the difference of the coupling coefficients of the respective semiconductor lasers whose coupling coefficients are increased (or decreased) when the diffraction gratings for generating a distribution feedback operation are formed in the same configuration and the refractive indexes of said diffraction grating embedded semiconductor layers are fixed at the same value.

In the above manufacturing method for collectively manufacturing, on a single substrate, an optical semiconductor integrated device comprises a plurality of semiconductor lasers which emit longitudinal single mode laser lights having different wavelengths due to a distributed feedback operation of a periodic change of the refractive index in the respective semiconductor lasers, and a plurality of optical semiconductor portions integrally formed with said semiconductor lasers for receiving respective laser lights from said plurality of semiconductor lasers, wherein the refractive indexes of said diffraction grating embedded semiconductor layers are decreased (or increased) so as to cancel the difference of the coupling coefficients of the respective semiconductor lasers whose coupling coefficients are increased (or decreased) when the diffraction gratings for generating a distributed feedback operation are formed in the same configuration and the refractive indexes of the diffraction grating embedded semiconductor layers are fixed at the same value.

In the above manufacturing method, said optical semiconductor integrated device comprises longitudinal single mode oscillating semiconductor lasers and optical modulators.

In the above manufacturing method, the band-gap wavelengths of said diffraction grating embedded semiconductor layers are made shorter (or longer) so as to cancel the difference of the coupling coefficients of the respective semiconductor lasers whose coupling coefficients are increased (or decreased) when the diffraction gratings for generating a distribution feedback operation are formed in the same configuration and the band-gap wavelength of said diffraction grating embedded semiconductor layers are fixed at the same value.

In the above manufacturing method, said diffraction grating embedded semiconductor layer is made of InGaAsP, and the change of the refractive index of said InGaAsP layer is executed by changing the compositional ratio of In and Ga in Group III.

In the above manufacturing method, said diffraction grating embedded semiconductor layer is made of InGaAsP, and the change of the band-gap wavelength is executed by changing the compositional ratio of As and P in Group V.

In the above manufacturing method, the method for changing the refractive index or the band-gap wavelength of said diffraction grating embedded semiconductor layer is a selective metal organic vapor phase growth method.

In the above manufacturing method, the method for changing the refractive index or the band-gap wavelength of said diffraction grating embedded semiconductor layer is provided by adjusting a flowing ratio of group V group materials in an atmospheric pressure double-fluid layer type metal organic vapor phase epitaxy method.

An optical communication module is provided by assembly of the above described semiconductor device or the semiconductor device made by the above manufacturing method with a waveguide device for guiding an output light from said optical semiconductor device to the outside, a mechanism for inputting the output light from said semiconductor device to the waveguide device, and an electrical interface for driving said semiconductor device.

An optical communication apparatus is provided by assembly of the above optical semiconductor device or the above semiconductor device manufactured by the above-described manufacturing method with an optical transmission device loaded with said optical communication module and a receiving device for receiving the output light from said light transmission device.

BRIEF DESCRIPTION OF THE DRAWINGS

FIG. 1 is a cross-sectional view of a semiconductor crystal for explaining the action of the present invention.

FIG. 2 is a cross-sectional view of a semiconductor crystal growth for explaining the action of the present invention.

DETAILED DESCRIPTION OF THE INVENTION

Figure 3:
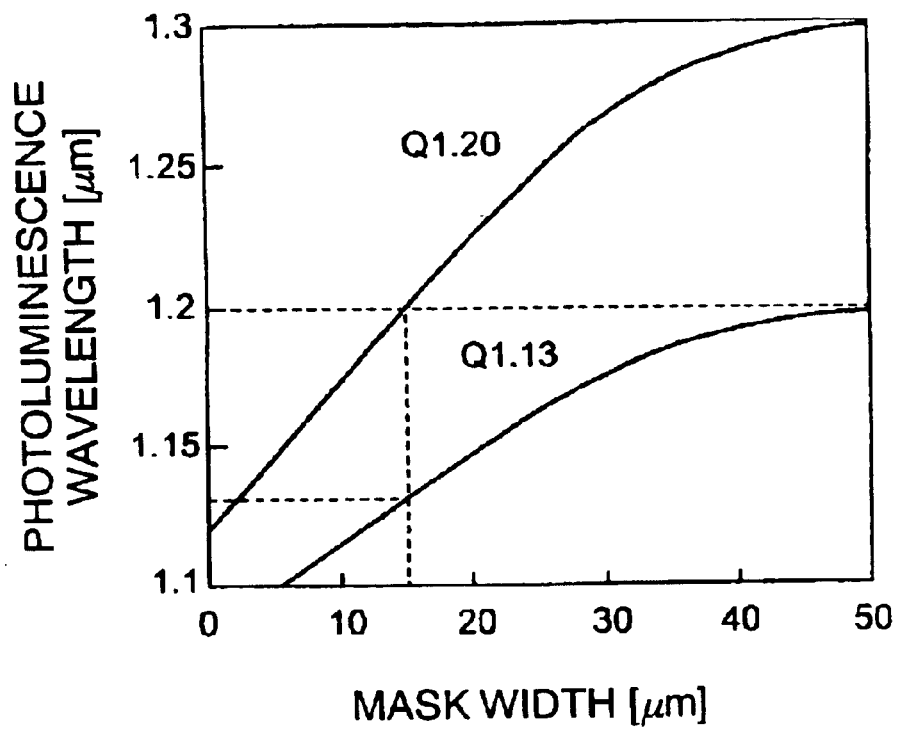
FIG. 3 is a characteristic diagram showing the relationship between the mask width and the photoluminescence wavelength for explaining the action of the present invention.

Hereinafter, an embodiment of the present invention is described with reference to the attached drawings. The inventors of the present invention have examined how the mask width and the coupling coefficient κ affect the properties of the present type of optical semiconductor device. A series of examinations has revealed an important fact in the relationship between the mask width or the coupling coefficient and the oscillating frequency of the DFB laser. That is, a technique was found by the present inventors to maintain the coupling coefficient constant even if the oscillating frequency changes with each DFB laser. In addition, several measures were also found for improving the characteristics of this type of optical semiconductor devices.

FIG. 1 shows a schematic cross-sectional view of an InGaAsP crystal grown by a selective MOVPE method. On the (100) InP substrate 1, an InGaAsP layer was selectively grown as a selective growing layer 3 by the MOVPE method using a pair of stripe-shaped SiO$_2$ masks formed in the [011] direction of a crystal plane separated by a space of 1.5 μm. As shown in FIG. 1, the crystal grows into a trapezoidal form, and the side facet and the top surface of the trapezoid are formed by the (111) B plane and the (100) plane, respectively. When the mask width Wm is increased, the growth rate (of the film thickness) is increased by the material supply from the masked region and it is known that the In content in the crystal composition increases. Utilization of this phenomenon makes it possible to produce, in one substrate surface, a plurality of layers respectively having different band-gap wavelengths only by changing mask width.

FIG. 2 shows a cross-sectional view of the DFB laser in the waveguide axis direction. The typical DFB laser structure is formed by first forming a diffraction grating 100 having a constant height $d_{GTG}$ on an InP substrate 101, and laminated layers on the diffraction grating comprising an InGaAsP guide layer 104, a multi-quantum well active layer 105, and an InP clad layer 106. In the case of forming the 1.55 μm band DFB laser, a composition having a band-gap wavelength of 1.0 to 1.3 μm is frequently used as that of the InGaAsP guide layer.

FIG. 3 shows a relationship between the photoluminescence wavelength and the mask width of the InGaAsP (Q1.13 means InGaAsP which band gap wavelength is 1.13 μm and Q1.20 means InGaAsP which bandgap wavelength is 1.20 μm) layers grown by the selective MOVPE with the growth condition of lattice matching to InP at a mask width of 15 μm. When the band-gap wavelength is 1.13 μm (Q is 1.13), and when the mask width is increased to 50 μm, the photoluminescence wavelength can be extended to 1.20 μm.

This extension of wavelength is due to the strain caused by the increase of the In content in the selectively grown layer induced by the increase of the mask width.

Figure 4:
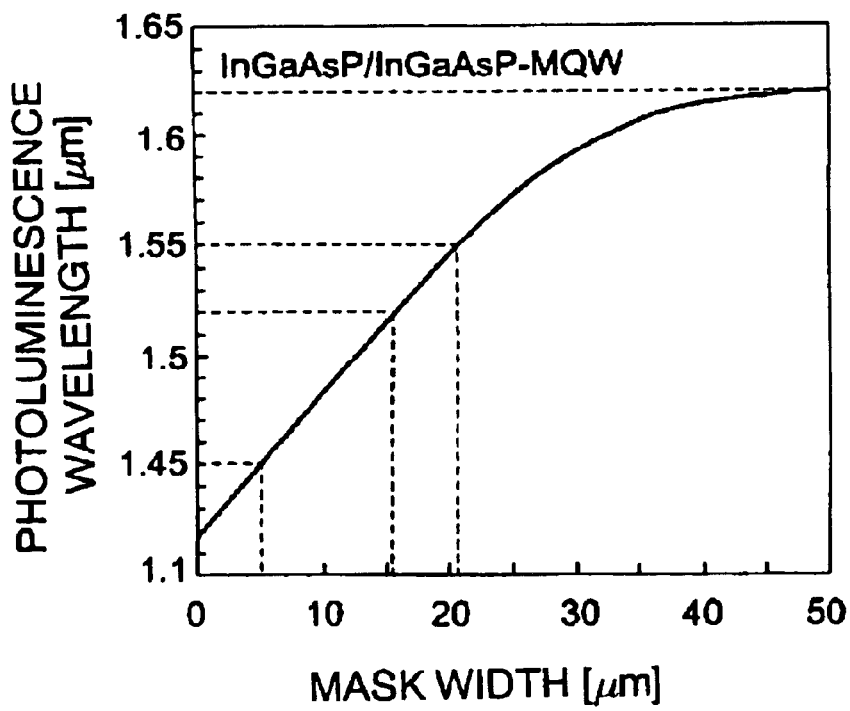
FIG. 4 is a characteristic diagram showing the relationship between the mask width and the photoluminescence wavelength for explaining the action of the present invention.

FIG. 4 shows an example of the relationship between the photoluminescence wavelength and the mask width when the MQW structure composed of InGaAsP/InGaAsP is grown by the selective MOVPE. In this case, the band-gap wavelength can cover a range of wavelengths from 1.52 μm to 1.62 μm when the mask width is increased from 15 μm to 50 μm. Moreover, the wavelength range of 1.45 μm to 1.55 μm can be covered when the mask width is increased from 5 μm to 21 μm. This wavelength range of 1.45 μm to 1.55 μm can be used as an operating wavelength range for the electro-absorption (EA) modulator to be integrated in combination with the above-described DFB laser having an oscillating wavelength range of 1.52 μm to 1.62 μm.

The issue is the wavelength dependency of the coupling coefficient κ when manufacturing the DFB lasers. At the time of manufacturing a plurality of different DFB lasers having a wavelength range of 1.52 μm to 1.62 μm by changing the mask width within a range of 15 μm to 50 μm, when the guide layer is formed using InGaAsP having a band-gap wavelength of 1.13 μm with a mask width of 15 μm on the diffraction grating, the photoluminescence wavelength of the guide layer changes from 1.13 μm to 1.20 μm. The change of the photoluminescence wavelength means a change in the band-gap wavelength induced by the change of the refractive index of the guide layer, which implies that the coupling coefficient κ changes due to the periodic change of the refractive index produced by the diffraction grating.

Figure 5:
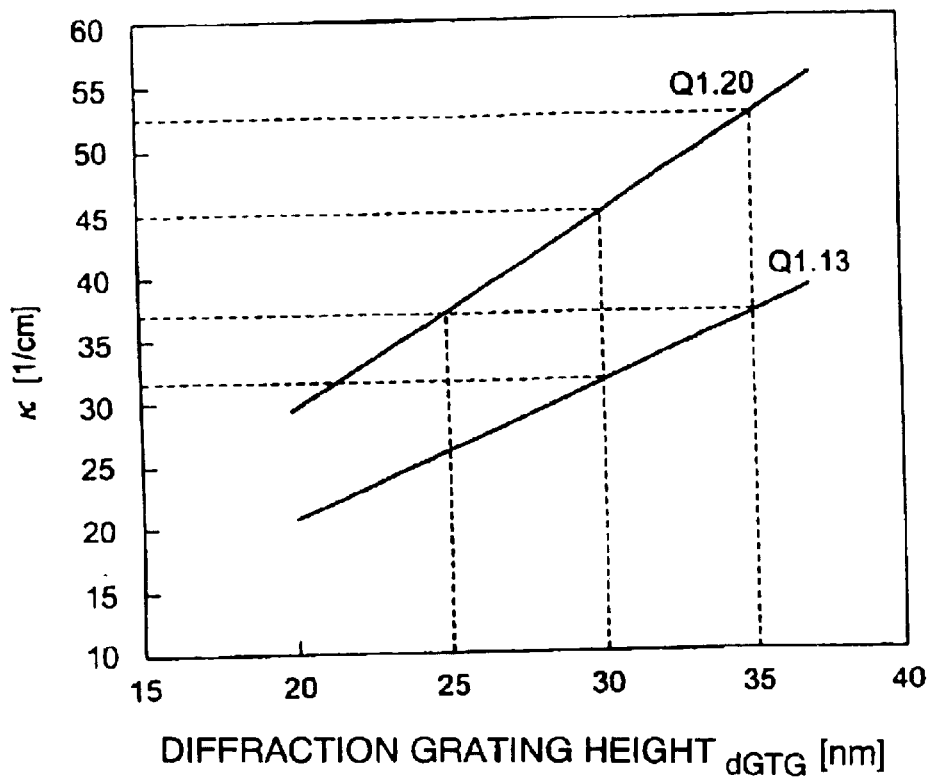
FIG. 5 is a characteristic diagram showing the results of theoretical calculation related to the relationship between the diffraction grating height and the coupling coefficient.

FIG. 5 shows the results of the calculation between the height $d_{GTG}$ of the diffraction grating, which has a proportional relationship with the change value of the periodic change of the refractive index, and the coupling coefficient using the composition of the guide layer as a parameter. When the band-gap wavelength changes with the change of the composition of the guide layer from 1.13 μm to 1.20 μm, it is anticipated that the coupling coefficient κ changes from 37.5 to 53 cm$^{-1}$.

Figure 6:
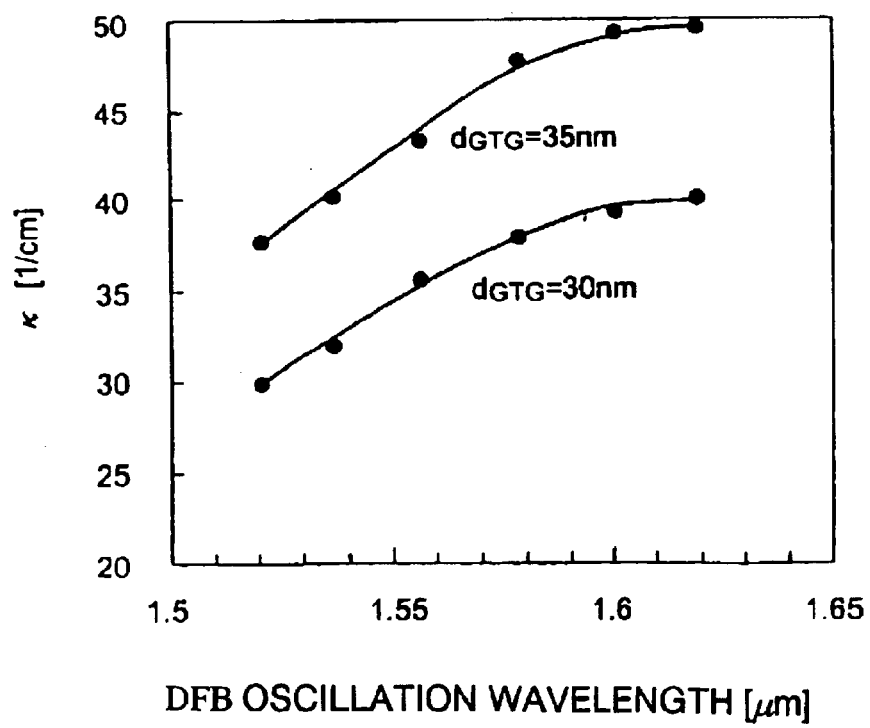
FIG. 6 is a device characteristic diagram showing the relationship between the oscillating wavelength and the coupling coefficient for explaining the action of the present invention.

An experiment was performed, obtaining the results shown in FIG. 6, for measuring the relationship between the coupling coefficient κ and the DFB oscillation wavelength of DFB lasers collectively formed in a single wafer having a wavelength range of 1.52 μm to 1.62 μm. In the above experiment, two different diffraction grating heights of 30 nm and 35 nm were tested. As a result, it was found that the coupling coefficient κ is changed from 30 to 40 cm$^{-1}$ when the diffraction gratings height is 30 nm, and from 38 to 50 cm$^{-1}$ when the height is 35 nm.

The above results show that the variations in the coupling coefficient κ for both diffraction grating heights are smaller than those expected from FIG. 5. This is due to the fact that the calculation in FIG. 5 did not take into account the increase of the light confinement coefficient in the laser active layer by the increase of the film thickness due to the increase of the mask width.

Below, a technique is described with reference to FIGS. 7 and 8 for collective formation of laser active layers having different band-gaps in one substrate surface by the selective MOVPE growth without changing the mask width.

In vertical MOVPE reactors, when the amount of the carrier gas is increased to move than the optimum amount for growing a film thickness homogeneous, the growth rate can be increased from the center to the outer periphery of the substrate (the homogeneity is degraded). Similarly, in horizontal MOVPE reactors, when the flow rate is increased to move higher than the optimum amount for growing the film thickness homogeneous, a distribution can be provided, in which the growth rate is increased from upstream to downstream in the direction of the gas flow. In contrast, if the MOVPE growth is carried out at a gas amount less than the optimum amount to for a film with a homogeneous thickness, the reverse film thickness distribution can be obtained.

Figure 7:
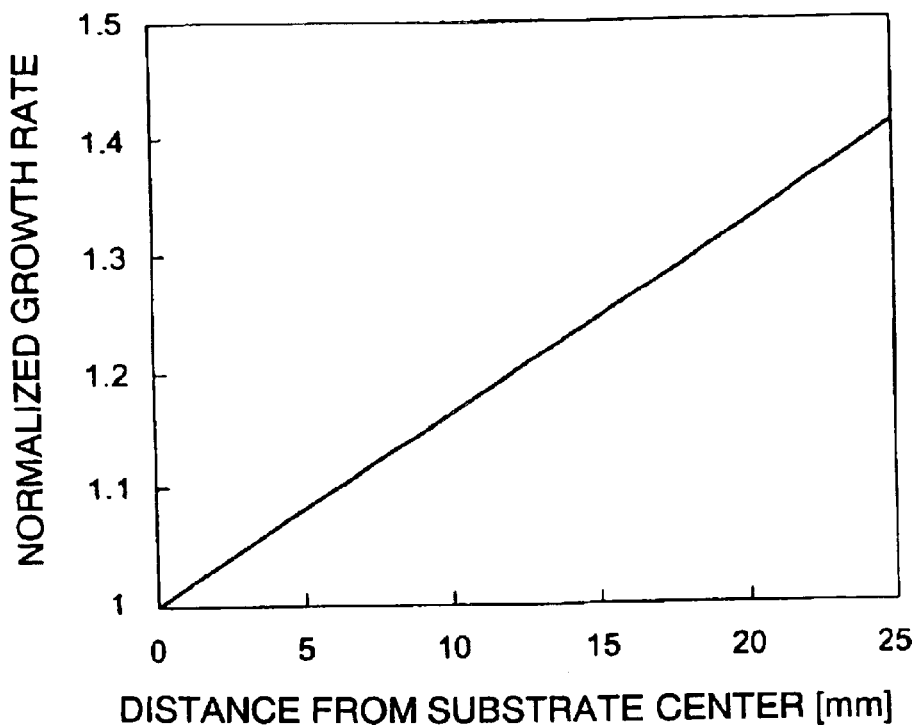
FIG. 7 is a diagram showing the crystal growth characteristics for explaining the action of the present invention.

FIG. 7 shows an example of the film thickness distribution when the flow rate is increased to 1.5 times higher than the optimum flow rate. As shown in FIG. 7, the growth rate distribution is represented as a function of the normalized growth rate, wherein the growth rate at the center of a 2 inch InP substrate is set at 1, against the distance from the center of the substrate. From the figure, the growth rate at the outermost periphery of the substrate is about 1.4 times larger than that at the center of the substrate.

Figure 8:
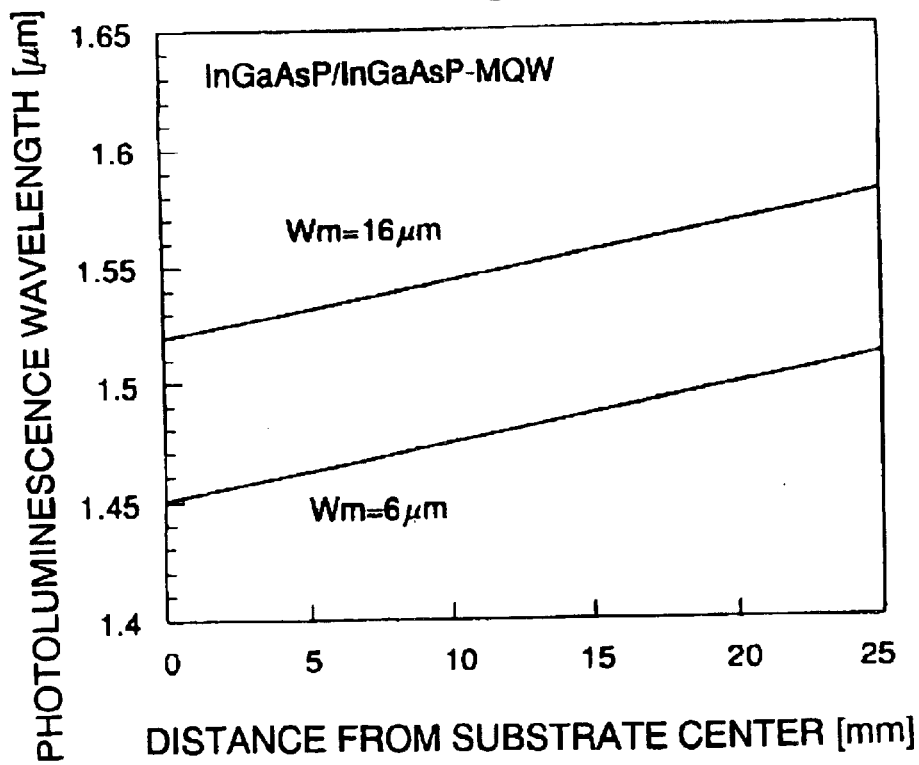
FIG. 8 is a diagram showing the crystal growth characteristics for explaining the action of the present invention.

The result of the photoluminescence (PL) wavelength distribution in the substrate surface of the InGaAsP/ InGaAsP multi-quantum well structure formed by selective growth using the above film thickness distribution is shown in FIG. 8. The multi-quantum well structure is the same as that shown in FIG. 2, and FIG. 8 shows two examples for when respective mask widths are 6 μm to 16 μm. When the mask width Wm=6 μm, the PL wavelength in the substrate surface distributed within a wavelength range of 1.46 μm (1460 nm) to 1.51 μm (1510 nm), and when the mask width Wm=16 μm, the PL wavelength distributed within a wavelength range of 1.53 μm (1530 nm) to 1.58 μm (1580 nm).

Accordingly, utilization of the structure having the above wavelength distribution makes it possible to execute the collective formation of the DFB lasers having different oscillation wavelengths on one substrate surface. It is possible to produce DFB lasers having a wavelength range of 1.53 μm to 1.58 μm by setting the mask width at 16 μm. The wavelength range of 1.46 μm to 1.51 μm can be covered by setting the mask width at 6 μm, and this wavelength range can be used as the operating wavelength range of the electro-absorption (EA) modulator for DFB lasers having an oscillating wavelength range of 1.53 μm to 1.58 μm.

An issue is the wavelength dependency of the coupling coefficients κ within the above oscillating wavelength range. Since the thickness of the MQW active layers in the different wavelength oscillating DFB lasers within the wavelength range of 1.53 μm to 1.58 μm reaches 1.4 times at maximum compared with the minimum, the optical field of the diffraction grating portion becomes weak because the light confinement coefficient in the MQW active layer of the long wavelength lasers having the higher layer thickness becomes large.

The change of the long distance transmission characteristics due to the change of the coupling coefficients κ is originated by the wavelength variation (wavelength chirp) induced by the residual reflection light from the end facet at the time of the modulation operation.

Figure 10:
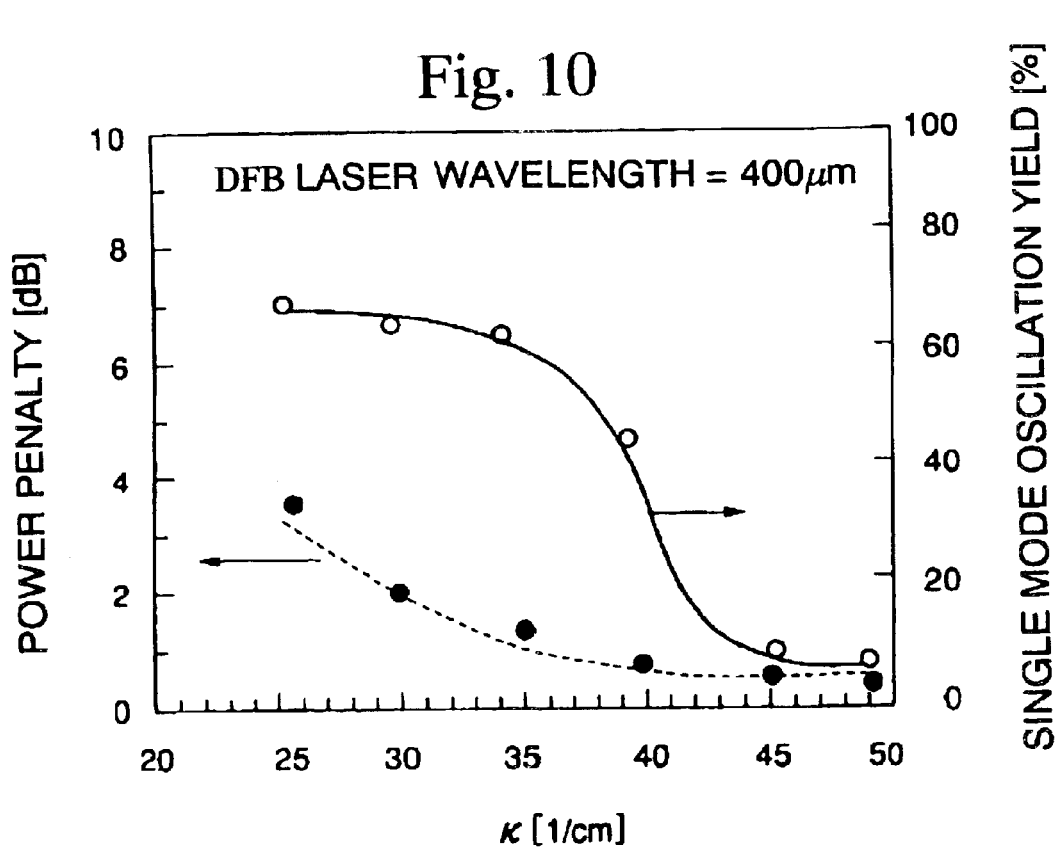
FIG. 10 is a diagram showing the device characteristics for explaining the action of the present invention.

FIG. 10 shows the relationship between the coupling coefficients κ and the power penalty after a 2.5 Gb/s modulated transmission over 600 km (indicated by broken line ●). The measurement was made using a device produced by monolithic integration of a 400 μm long uniform diffraction grating-type DFB laser with a 200 μm long EA modulator. The power penalty after transmission over 600 km decreases with an increase of the coupling coefficients κ, and a power penalty less than 1 dB is obtained when the coupling coefficients κ>37 cm$^{-1}$. In contrast, the relationship (the real line ○) between the coupling coefficient κ and the longitudinal single mode oscillation yield shows that the yield is reduced by the larger effect of the spatial hole burning as the coupling coefficient κ increases. Therefore, it is very important to control the coupling coefficient κ to within a certain range.

Figure 11:
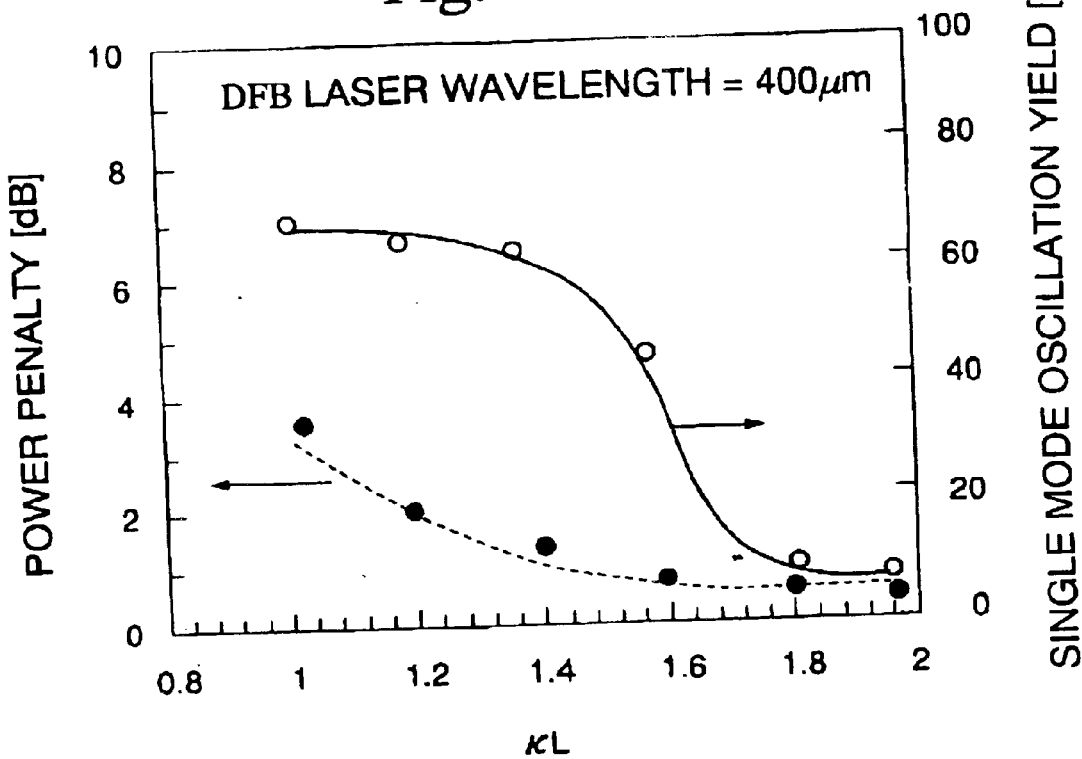
FIG. 11 is a diagram showing the device characteristics for explaining the action of the present invention.

FIG. 11 shows a similar relationship between the power penalty and the product κL of the coupling coefficient κ and the DFB laser oscillator length L and the product κL must be more than 1.5 in order to obtain a power penalty less than 1 dB.

In the case of collective formation of the different wavelength DFB laser, the elements integrated in the multiple wavelength laser necessarily involve the change of the coupling coefficient κ, since each laser active layer structure (composition or film thickness) differs from each other in order to provide elements having different wavelengths.

However, it becomes possible to control the change of the coupling coefficient κ, since the coupling coefficient κ can be controlled not only by the change of the height of the diffraction grating but also by the composition of the guide layer (band-gap wavelength) on the diffraction grating, as shown in FIG. 5. That is, the change of the coupling coefficient κ can be cancelled by controlling the band-gap wavelength of the guide layer on the diffraction grating independent from the MQW structure which determines the band-gap wavelength of the laser active layer.

Figure 9:
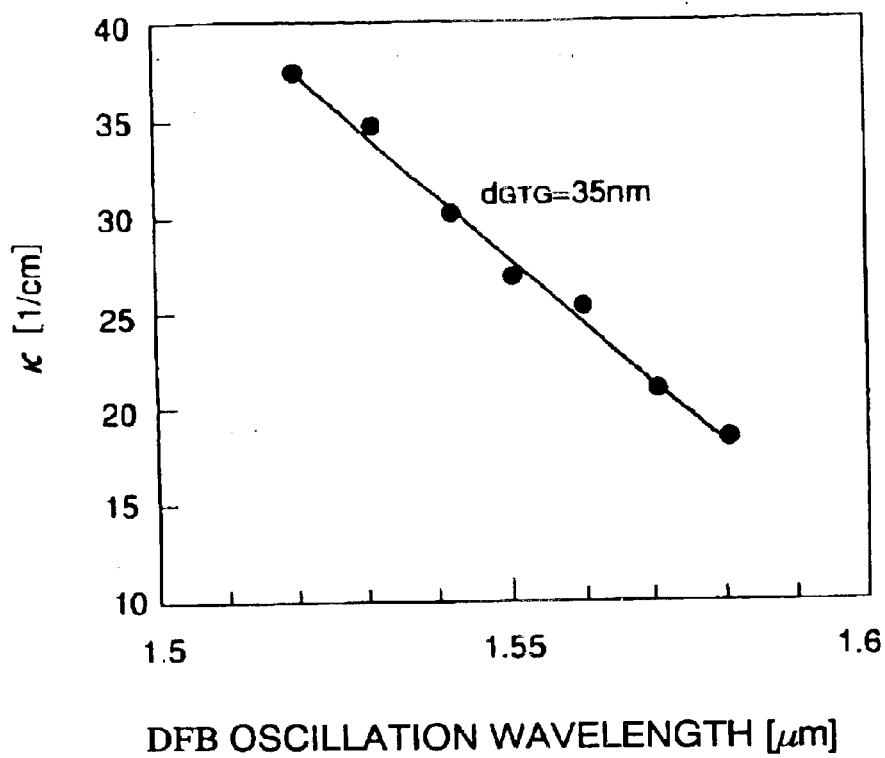
FIG. 9 is a diagram showing the device characteristics for explaining the action of the present invention.
Figure 12:
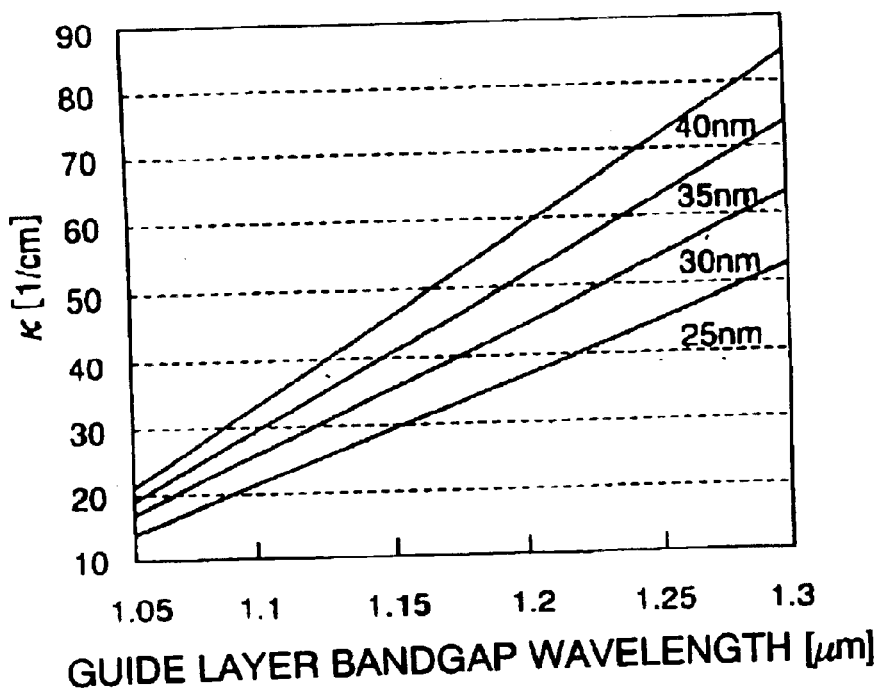
FIG. 12 is a characteristic diagram showing the results of theoretical calculations as a parameter of the diffraction grating height for explaining the action of the present invention.

FIG. 12 shows the results of the calculation regarding the relationship between the band-gap wavelength and the coupling coefficient κ when changing the height of the diffraction grating as parameters. In this case, the calculation is carried out based on the MQW structure of the DFB laser with an oscillating wavelength of 1.52 μm, whose coupling coefficient κ dependent on the oscillating wavelength is shown in FIG. 9. As shown in FIG. 12, the coupling coefficient κ increases into two times from 37.5 cm$^{-1}$ to 75 cm$^{-1}$ when the band-gap wavelength is varied from 1.13 μm to 1.30 μm.

Accordingly, when collectively manufacturing a DFB laser having a wavelength from 1.52 μm to 1.58 μm (the coupling coefficient κ is reduced to 50% for elements having wavelengths from 1.52 μm to 1.58 μm), it is possible to maintain the coupling coefficient at a constant value by changing the band-gap wavelength of the guide layer from 1.13 μm to 1.30 μm.

Next, a few methods are provided for controlling the band-gap wavelength of the guide layer independently of the MQW. The first method is to form the guide layer on the diffraction grating and the MQW active layer by respective selective MOVPEs. It is possible to change the band-gap wavelength (photoluminescence wavelength) from 1.12 μm to 1.30 μm within a mask width of 2 to 50 μm when the InGaAsP layer having the band-gap wavelength of 1.20 μm (Q1.20) is grown by the selective MOVPE at the mask width of 15 μm under the lattice matching condition.

The second method is to grow the guide layer under intentionally non-homogeneous growing condition using an atmospheric pressure double fluid layer flow-type MOVPE. Although the atmospheric pressure double fluid layer flow-type MOVPE is disclosed in detail in *The Journal of Crystal Growth*, 145, p. 622, 1994, the principle is briefly described below with reference to FIG. 13.

Figure 13:
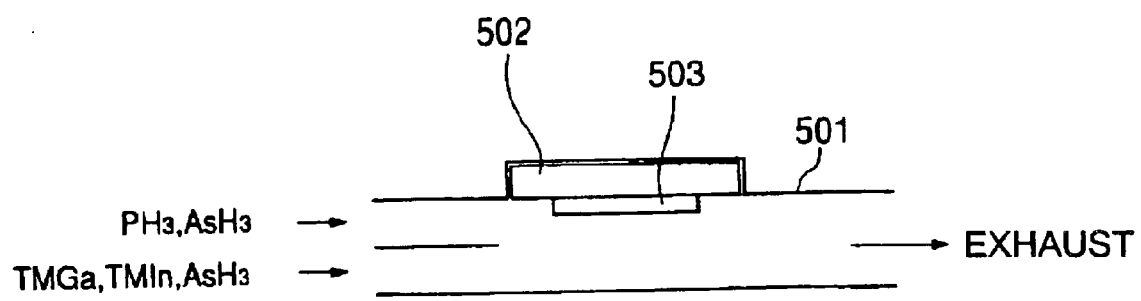
FIG. 13 is a cross-sectional view of a crystal growing apparatus for explaining the action of the present invention.

The reaction tube 501 of the atmospheric pressure double fluid layer flowing-type MOVPE reactor has a material inlet, which is divided into two upper and lower layer-shaped inlets with respect to the semiconductor substrate 503 supported by the substrate holder 502, as shown in FIG. 13. The reaction tube 501 is constituted such that arsine (AsH$_3$) and phosphine (PH$_3$), which belongs to Group V, are supplied from the upper layer-shaped inlet located near the substrate and the materials, which belongs to Group III such as trimethylgallium (TMGa), or trimethylindium (TMIn), are supplied from the lower layer-shaped inlet located far from the substrate.

Generally speaking, the reason it is difficult to carry out the homogeneous growth of the InGaAsP by the MOVPE growth is that the existing ratio of As and P atoms differs on the substrate surface due to the large difference in the decomposition rate constants of AsH$_3$ and PH$_3$ (the decomposition rate of AsH$_3$ is about ten times larger than that of PH3 t a growth temperature of 600 to 650° C.). Thus, this MOVPE growth is characterized in that PH$_3$ having a small decomposition rate constant, is supplied from the upper layer-shaped inlet located close to the substrate, and AsH$_3$ is supplied from both upper and lower inlets such that the homogeneous growth of the InGaAsP is attained by conforming the numbers of As atoms with P atoms reaching the substrate surface by adjusting the AsH$_3$ flow rate of the upper inlet and the lower inlet.

Figure 14:
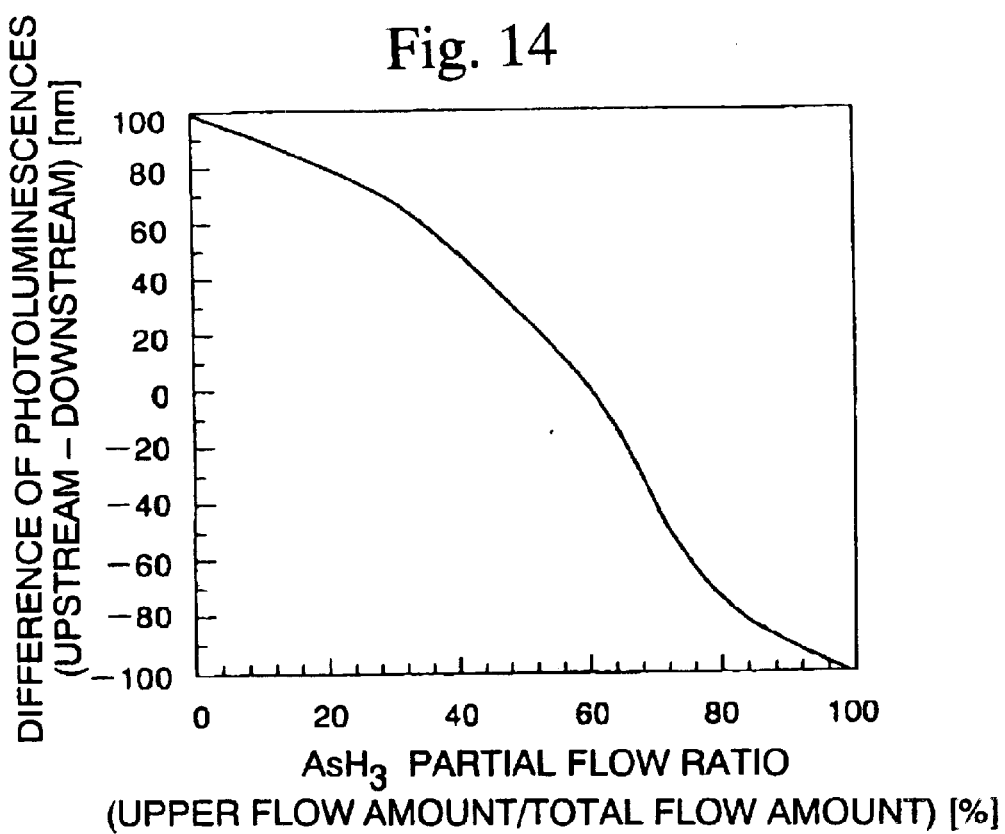
FIG. 14 is a characteristic diagram showing the crystal growth characteristics for explaining the action of the present invention.

Thus, when the crystal growth of the guide layer is carried out under a condition, which are shifted from that for homogeneous growth by changing the flow-rates from the upper and lower layer-shaped inlets, it is possible to change the photoluminescence wavelength of the guide layer along the flowing direction of the material gas. FIG. 14 shows an example. In FIG. 14, the abscissa shows a gas flow ratio (=the partial flow rate of AsH$_3$ from the upper inlet divided by the total flow rate of AsH$_3$ from both upper and lower inlets) and the vertical axis shows differences of the photoluminescene wavelengths of the grown crystal of Q1.25 (InGaAsP having a composition corresponding to the band-gap wavelength of 1.25 μm) at the material gas inlet side and the material gas outlet side. As shown in FIG. 14, maximum homogeneous growth is obtained at a flow ratio of 60%, and when the flow ratio is lower than 60%, the wavelength of the crystal at the material gas inlet side shifts to a longer wavelength and when the flow ratio is higher than 60%, the wavelength of the crystal at the gas outlet side shifts to a longer wavelength.

The above-described experimental results indicates that it is possible to provide a maximum band-gap wavelength difference of 100 nm. Accordingly, the variation of the coupling coefficient can be cancelled by collectively forming the different wavelength DFB laser such that the oscillating wavelengths of the crystal grown on the substrate change along the direction of the gas flow and by growing the guide layer on the diffraction grating by the above-described non-homogeneous condition such that the band-gap wavelength changes due the direction of the gas flow.

Hereinafter, the manufacturing method of the semiconductor device of the present invention is explained in detail with reference to the attached drawings.

Figure 15:
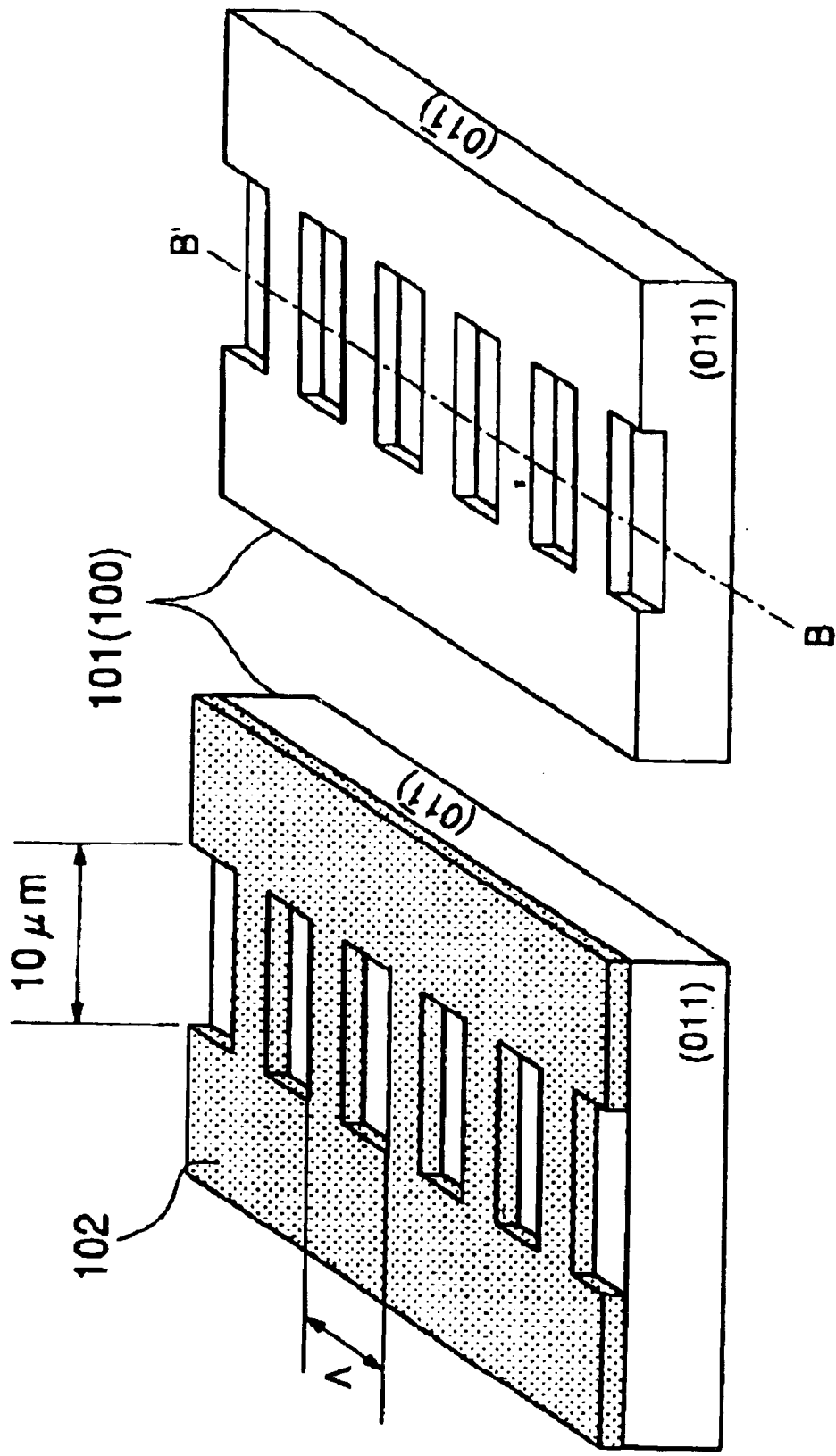
FIGS. 15A and 15B are perspective views showing manufacturing processes according to one embodiment of the present invention.
Figure 16:
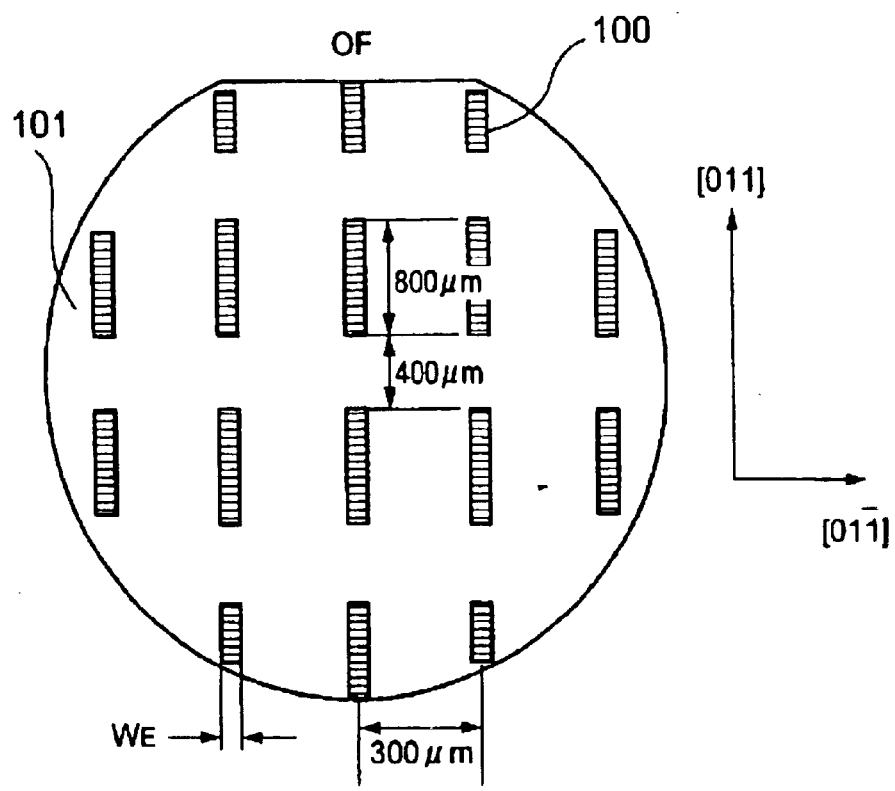
FIG. 16 is a plan view showing a manufacturing process according to one embodiment of the present invention.

First, a method for collective manufacturing the different wave EA modulator integrated-type DFB laser according to the first embodiment of the present invention is described. As shown in FIG. 15, after coating the electron beam sensitive positive resist 102 on the (100) n-InP substrate 101, a pattern, as shown in FIG. 15A, is formed by electron-beam exposure.

Subsequently, a diffraction grating, as shown in FIG. 15B, is formed by etching the n-InP substrate 101 with an HBr:H$_2$O-type etching solution using the resist 102 as the mask.

The diffraction grating is formed as a pattern, in which a diffraction grating formation region with a length of 800 μm in the [011] direction and a non-diffraction grating formation region with a length of 400 μm are repeatedly formed in the [01-1] direction.

In order to provide an EA modulator integrated DFB laser, the pitch Λ of the diffraction grating is set within a range of 235.05 to 244.30 nm which can yields oscillating waveelengths ranging from 1.52 to 1.58 μm.

Figure 18:
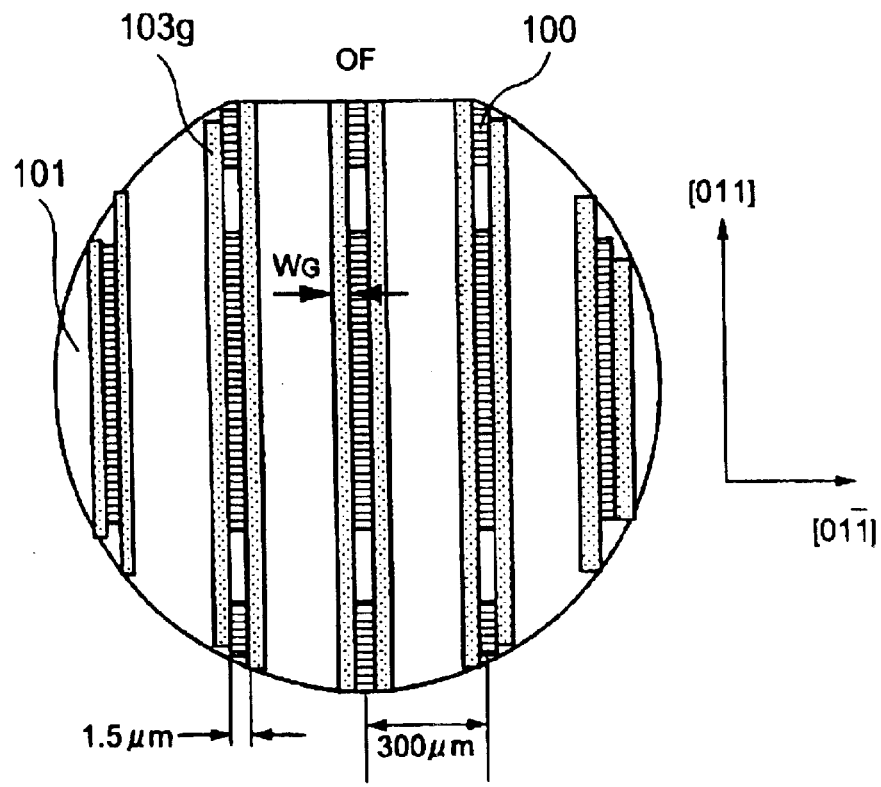
FIG. 18 is a plan view showing the substrate surface for explaining one embodiment of the present invention.
Figure 19:
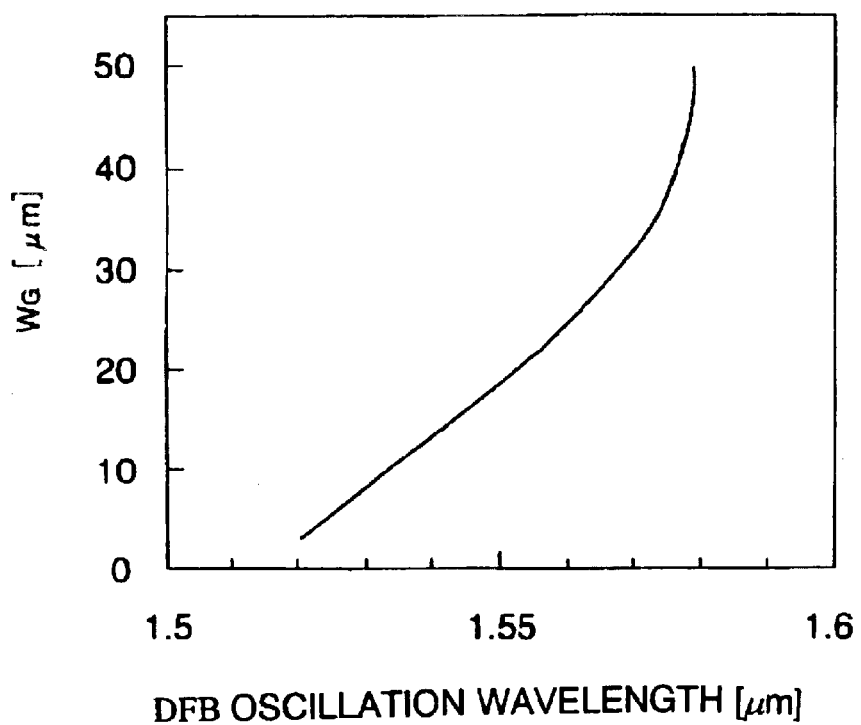
FIG. 19 is a characteristic diagram explaining one embodiment of the present invention.

Subsequently, a pair of stripe masks 103g made of SiO$_2$ for forming a guide layer on the diffraction grating by the selective MOPVE growth is obtained by patterning as shown in FIG. 18. The relationship between the width W$_G$ of the SiO$_2$ mask for the selective MOPVE growth and the DFB laser oscillating wavelength is shown in FIG. 19. In the collective formation of the DFB laser having a wavelength range of 1.52 μm to 1.58 μm, the width W$_G$ is characterized in being set larger as the DFB oscillating wavelength increases to a longer wavelength, wherein the coupling coefficient κ becomes smaller, as shown in FIG. 9. The n-InGaAsP guide layer 104 (band-gap wavelength is 1.20 μm, the thickness is 150 nm, n=1×10$^{18}$ cm$^{-3}$) is grown by the MOVPE growth in the region of W$_G$=15 μm under a lattice matching condition.

It has been confirmed from the microscopic photoluminescence measurement of the selectively grown guide layer that the mask width dependence of the band-gap wavelength can be reproduced as shown in FIG. 3.

Figure 20:
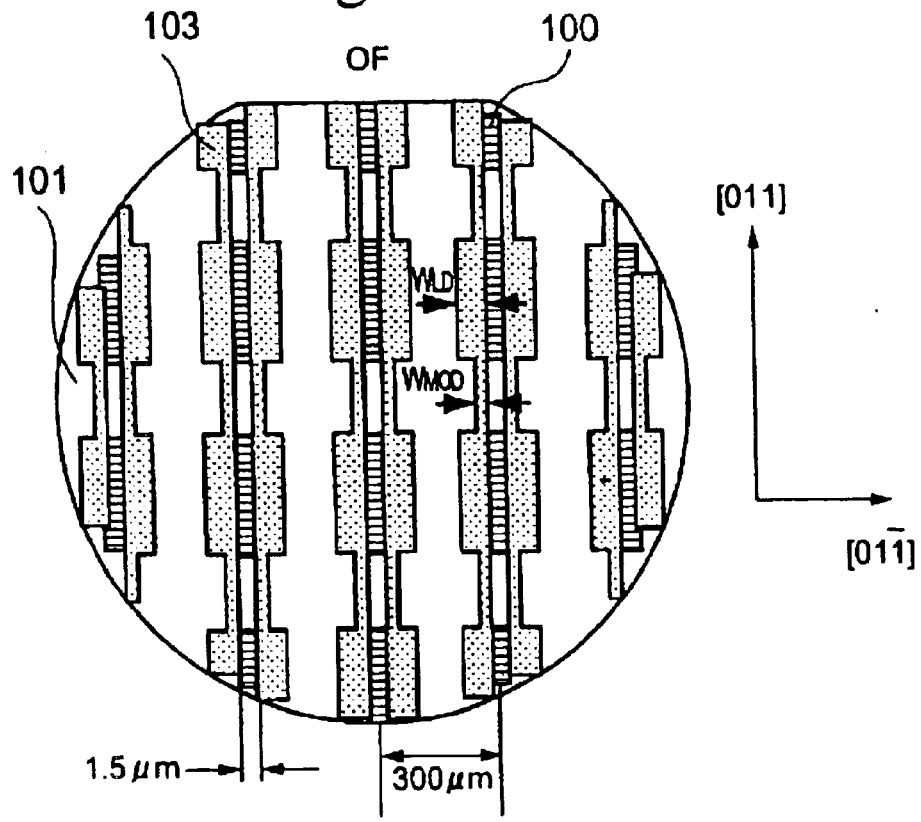
FIG. 20 is a plan view explaining one embodiment of the present invention.

Subsequently, a pair of SiO$_2$ masks used for the selective MOPVE growth is re-patterned so as to be synchronous with the diffraction grating 100. Here, as shown in FIG. 20, the mask width is set at W$_{LD}$ in the region wherein the diffraction grating is formed, and the mask width is set at W$_{MOD}$ in the region wherein no diffraction grating is formed. Although not shown in FIG. 20, the n-Q1.20 guide layer is formed in the aperture region where no diffraction grating is formed, as explained in FIGS. 18 and 19.

Figure 21:
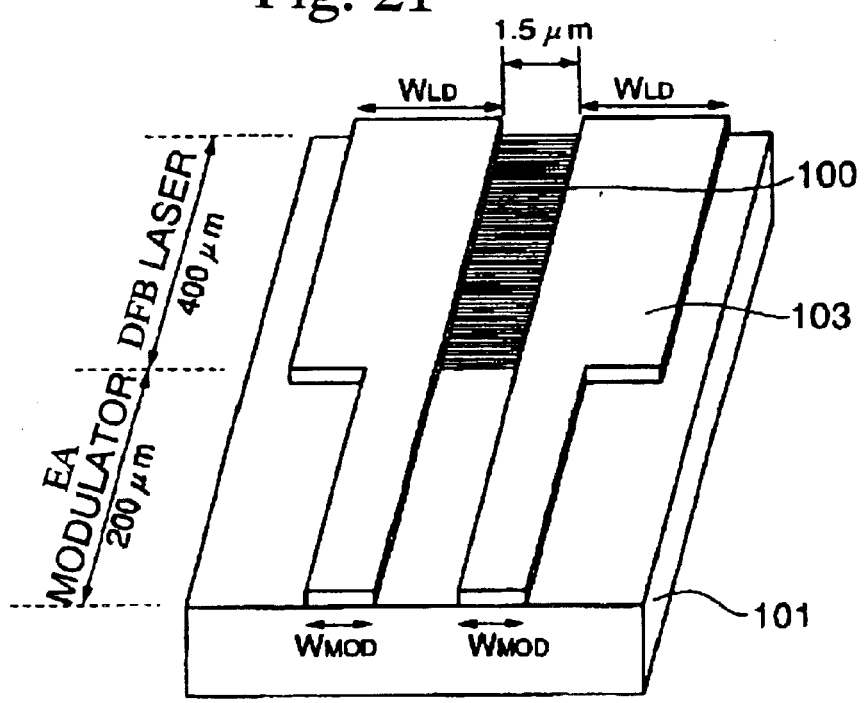
FIG. 21 is a perspective view explaining one embodiment of the present invention.

FIG. 21 illustrates the SiO$_2$ mask pattern for one element (the n-Q1.20 guide layer is not shown in this figure). That is, the region where the mask width is set at W$_{LD}$ (400 μm in length) is used for forming the DFB laser, and the region where the mask width is set at W$_{MOD}$ (200 μm in length) is used for forming the EA modulator. The space between one pair of SiO$_2$ stripe masks is fixed at 1.5 μm. The W$_{LD}$ is fixed at 16 μm and the W$_{MOD}$ is set at 6 μm.

Figure 17:
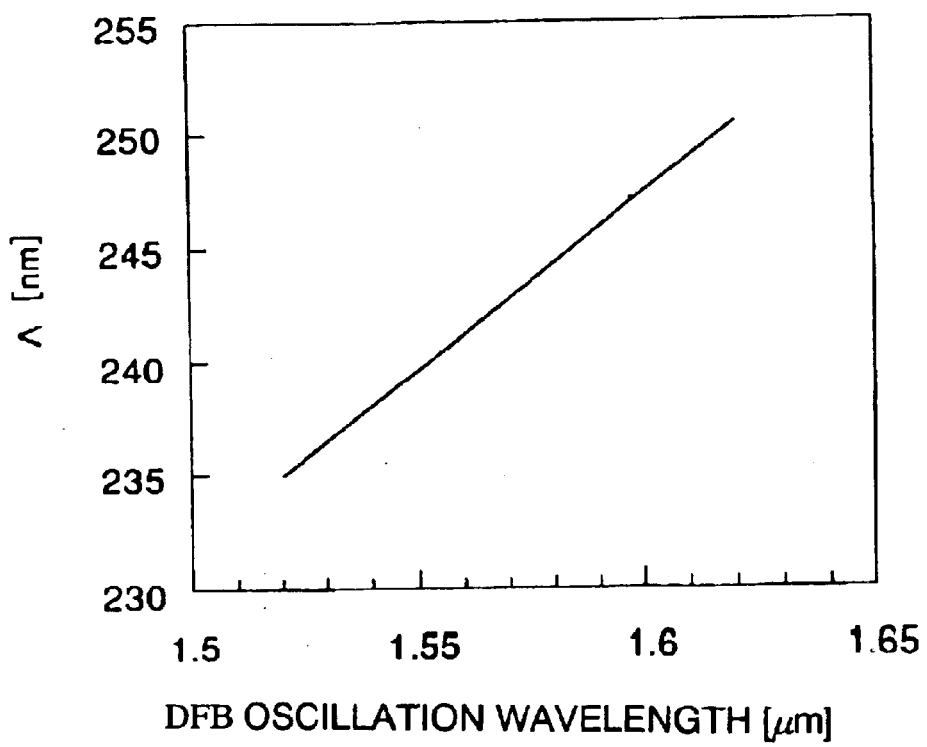
FIG. 17 is a diagram showing the theoretical characteristics of one embodiment of the present invention.

In FIGS. 17 and 19, the pitch Λ and the width W$_G$ of the diffraction grating are shown to have a continuous relationship with the oscillating frequencies. However, in this embodiment, since the range of the oscillating wavelengths 1.52 μm to 1.58 μm are divided into 75 wavelengths by an interval of 100 GHz (approximately 0.8 nm), the actual lines in FIGS. 17 and 19 are actually composed of 75 discontinuous dots.

Subsequently, the MQW laser active layer and the modulator absorption layer are grown by the selective MOVPE growth. The crystal growth by the selective MOVPE growth is carried out under conditions so as to provide a film having the thickness distribution as shown in FIG. 7.

On the n-InGaAsP guide layer 104, already described in FIG. 18, a strained MQW layer 105 (8 cycles of well layers of InGaAsP (+0.60% compressively strained, 10 nm thick) and barrier layers of InGaAsP (the band-gap wavelength is 1.20 μm, 9 nm in thickness)) and a p-InP layer 106 (150 nm in thickness, p=5×10$^{17}$ cm$^{-3}$) are formed. The photoluminescent wavelengths in the W$_{LD}$ layer (=16 μm) and the W$_{MOD}$ layer (=6 μm) distribute respectively within a range of 1.52 to 1.58 μm and a range of 1.45 to 1.51 μm.

Figure 22:
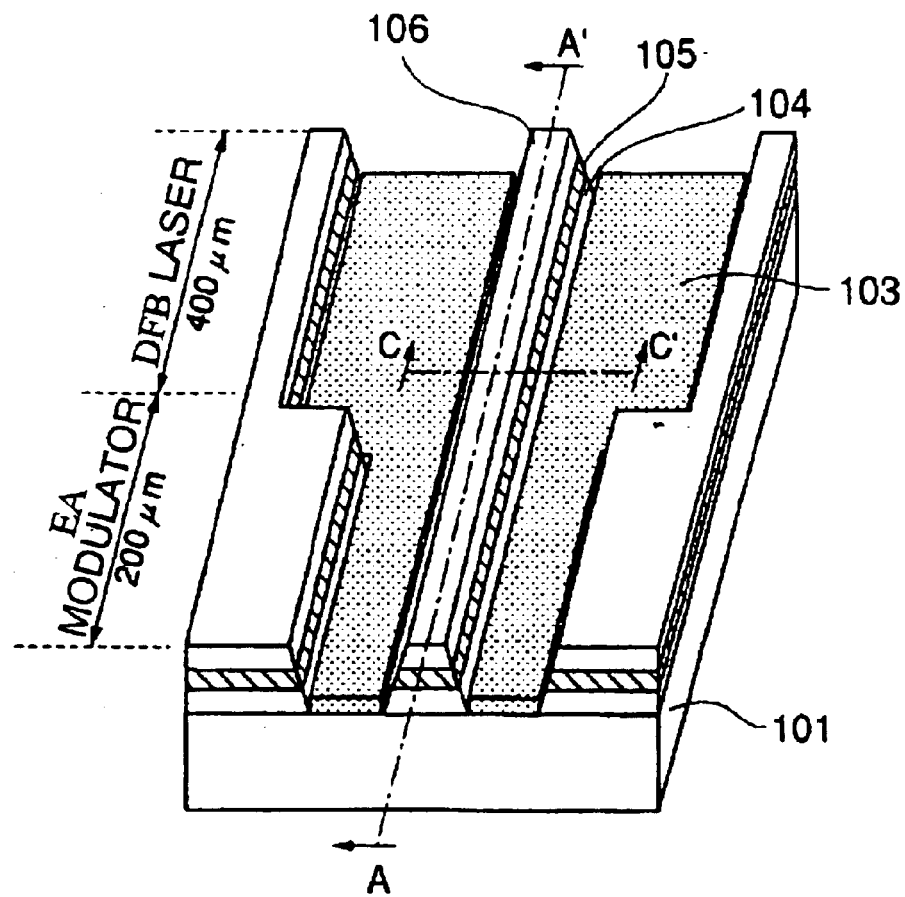
FIG. 22 is a perspective view explaining one embodiment of the present invention.
Figure 23:
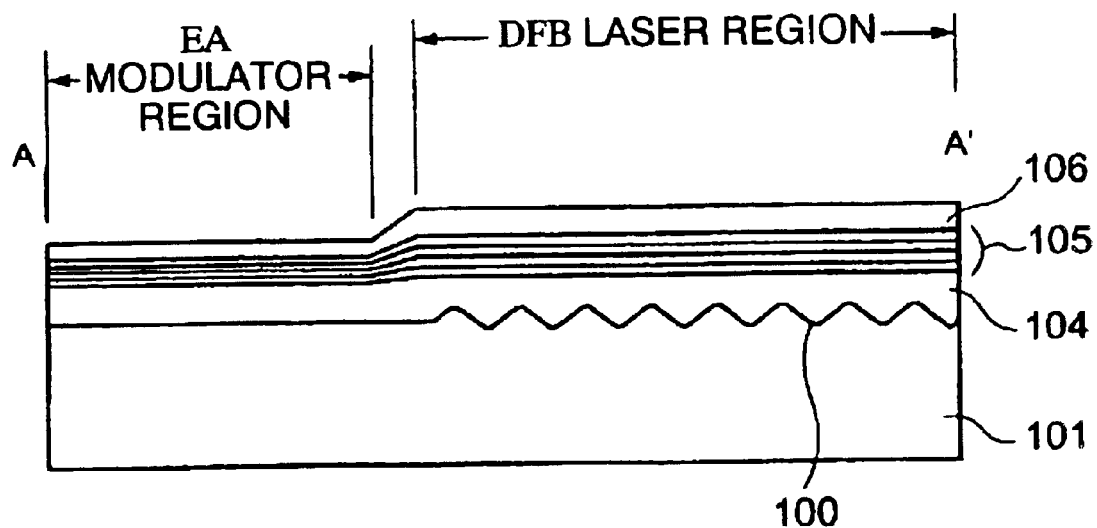
FIG. 23 is a cross-sectional view along the A-A' line in FIG. 22.

As shown in FIG. 23, which is a cross-sectional view along the A-A'line shown in FIG. 22, the diffraction grating is present in the DFB laser region. The band-gap wavelength of the Q1.20 guide layer 104 on the diffraction grating changes from 1.13 μm to 1.30 μm corresponding to the changing design oscillating wavelengths. Consequently, it is expected that the coupling coefficient κ can be maintained at κ=37.5 cm$^{-1}$ irrespective of the change of the oscillating frequency.

Figure 24A:
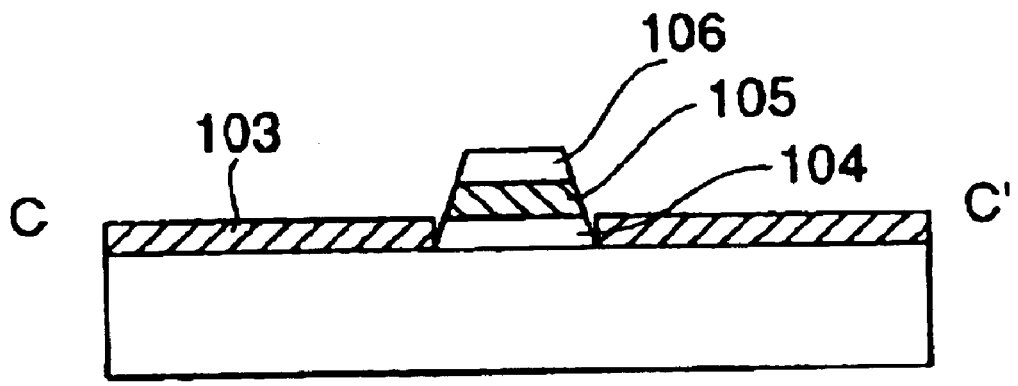
FIGS. 24A to 24C are cross-sectional views along the C-C' line in FIG. 22 for explaining the manufacturing processes according to one embodiment of the present invention.
Figure 24B:
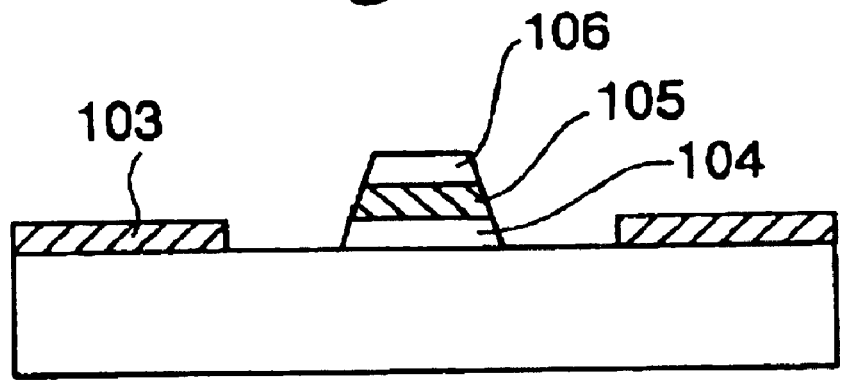
Figure 24C:
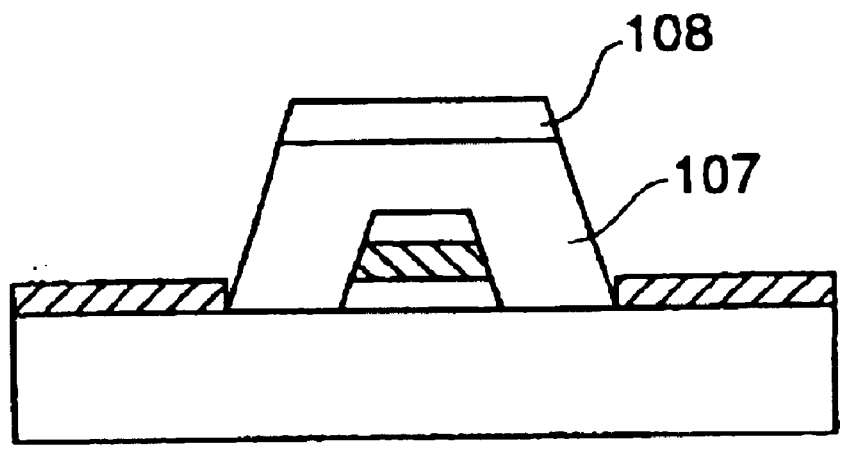
Figure 25:
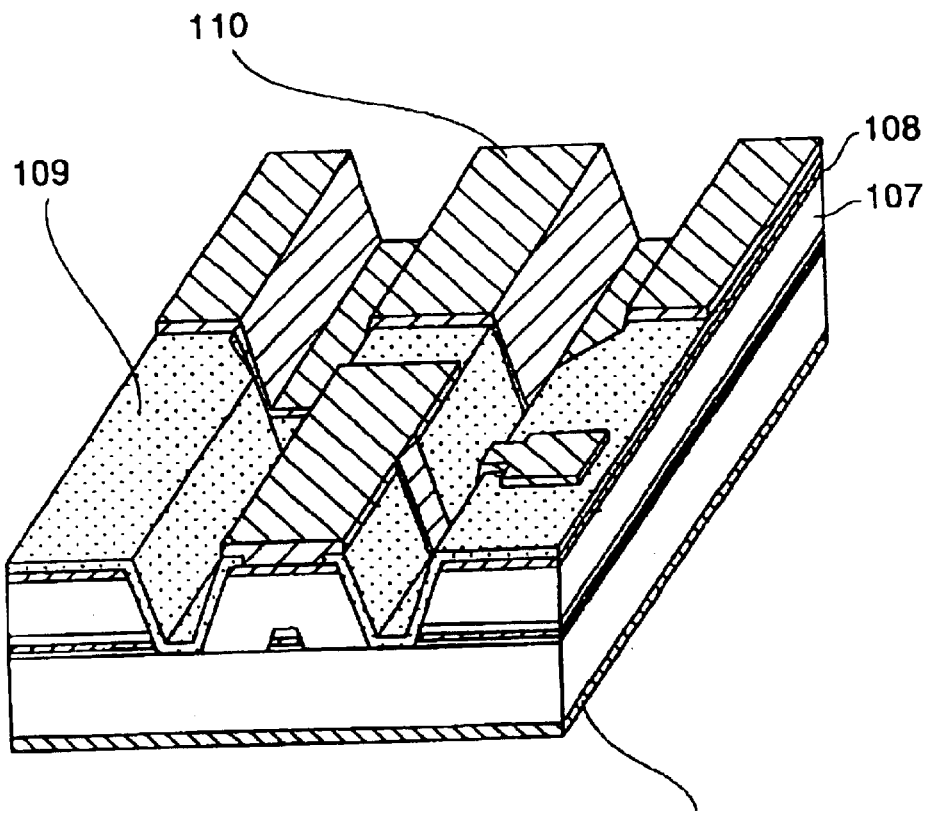
FIG. 25 is a perspective view explaining one embodiment of the present invention.

As shown in FIG. 24, which is a cross-sectional view along the C-C' line shown in FIG. 22, both side portions of the SiO$_2$ layer located at both sides of the selective growth layer are removed (FIG. 24B), after forming a p-InP clad layer 107 (1.5 μm in thickness and p=1×10$^{18}$ cm$^{-3}$) and a P$^+$-InGaAs cap layer 108 (0.25 μm in thickness, p=6×10$^{18}$ cm$^{-3}$) by the selective MOVPE growth as shown in FIG. 24C, electrical separation is performed by removing the p$^+$-InGaAs cap layer 108 with a width of 30 μm between the DFB laser region and the EA modulator region. As shown in FIG. 25, a p-type electrode 110 is formed by patterning using the SiO$_2$ film 109 as the interlayer insulating film, and an n-type electrode 111 is formed after back grinding is carried out until the thickness of the n-InP substrate is reduced to 120 μm. A total length of 600 μm of the thus formed substrate including the DFB laser portion of 400 μm in length and the EA modulator portion of 200 μm in length is cut into elements. Each element is subjected to the evaluation of the device characteristics after coating a high reflection film with a reflectance of 95% at the end facet of the DFB laser portion and after coating an anti-reflection film with less than 0.1% reflectance at the end facet of the modulator.

First, the oscillating wavelength characteristics of this different wavelength collectively formed EA modulator integrated DFB laser are examined. DFB laser oscillating wavelengths of the 75 thus produced elements are plotted in FIG. 26 in sequence. It is confirmed that the wavelengths of these elements from channel 1 to channel 75 are shifted from one to the next channel by 0.8 nm as intended and multiple wavelength laser elements covering the wavelength range of 1520 to 1580 nm (1.52 to 1.58 µm) are provided on one substrate surface.

Figure 27:
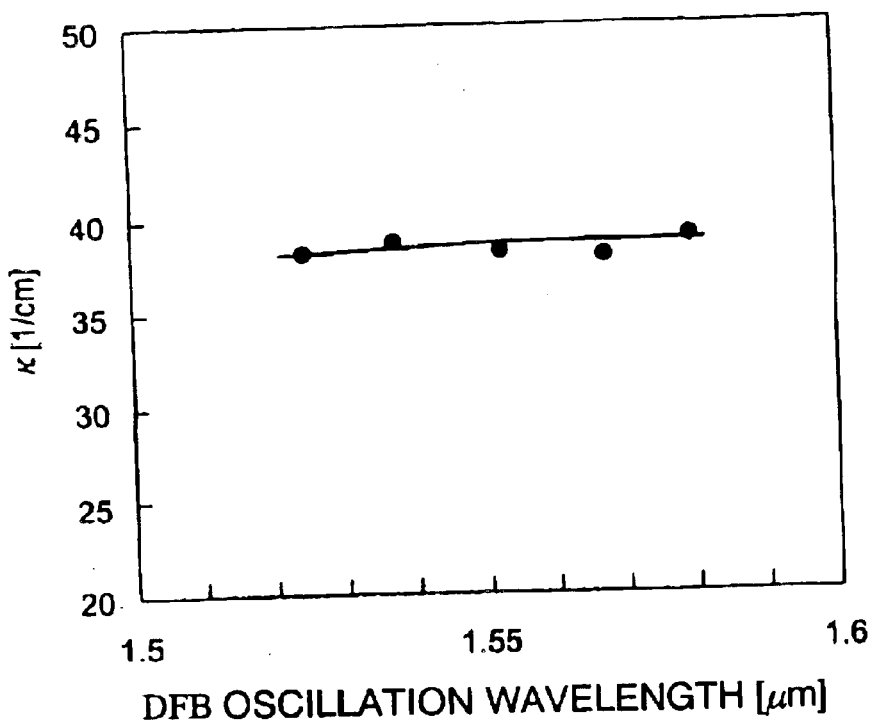
FIG. 27 is a characteristic diagram explaining one embodiment of the present invention.

Next, the coupling coefficients κ for some elements having different wavelengths are evaluated. Consequently, it has been confirmed, as shown in FIG. 27, that the coupling coefficient is maintained approximately at a designed value of 37.5 cm$^{-1}$ irrespective of the change of the oscillating wavelength. This result is obtained by utilizing the effect of the present invention that the band-gap wavelengths of the InGaAsP guide layers for respective elements on the diffraction grating are changed corresponding to the oscillating wavelengths of the elements.

Figure 28:
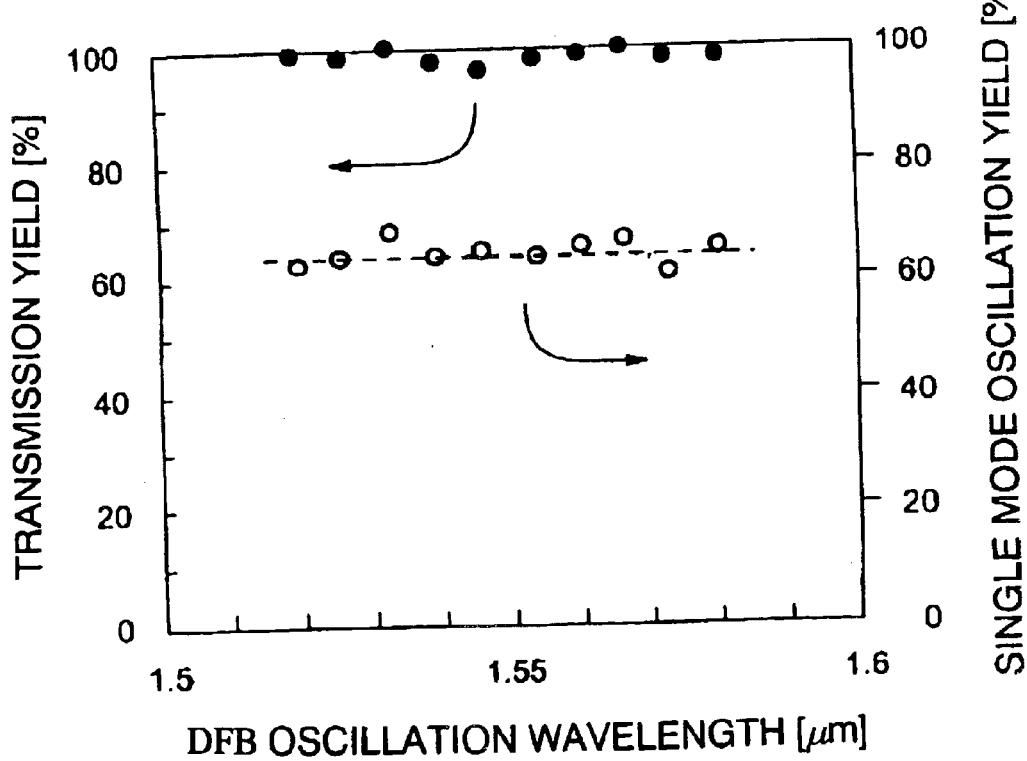
FIG. 28 is a characteristic diagram explaining one embodiment of the present invention.

As a result, as shown in FIG. 28, the transmission yield, obtained by use of a standard that the power penalty after 2.5 Gb/s transmission over 600 km is less than 1 dB, is more than 95% in all wavelength ranges, while the single longitudinal mode oscillation yield is maintained to more than 60% irrespective of the oscillation wavelength.

Figure 29:
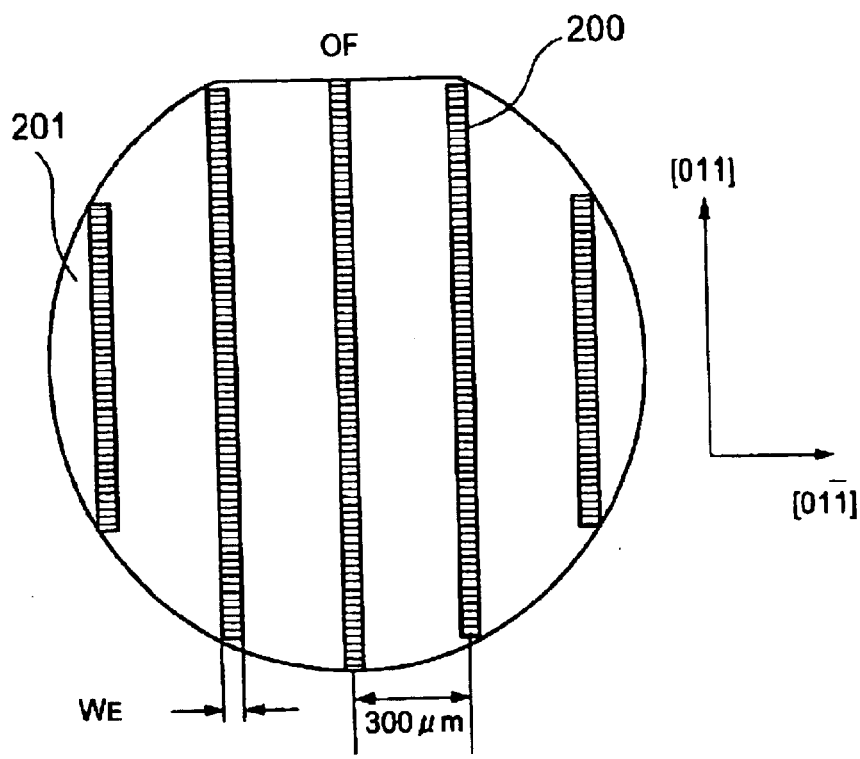
FIG. 29 is a plan view of a substrate surface explaining one embodiment of the present invention.

Next, a collective manufacturing method for a different wavelength DFB laser according to the second embodiment is described below. Similar to the first embodiment, the diffraction grating is formed by electron beam exposure and etching. As shown in FIG. 29, the diffraction grating is formed on the entire region of the [01–1] direction, and a repeating pattern is formed t a pitch of 300 µm in the [01–1] direction. In order to provide a different wavelength DFB laser, the diffraction grating pitch Λ is controlled from 235.05 to 244.30 nm in order to control the DFB oscillating wavelengths to within a range of 1.52 µm to 1.58 µm, corresponding to the DFB oscillating wavelength. In this embodiment, the etching amount shown in FIG. 15B is controlled so as to obtain a grating height of 30 nm.

Subsequently, a plurality of SiO$_2$ stripe masks 203g are formed by the patterning process for growing the guide layer on the diffraction grating 200 by the MOVPE growth. The mask width is represented by W$_G$. The relationship shown in FIG. 19, between the mask width W$_G$ for forming the guide layer by the MOVPE growth and the oscillating frequencies of the DFB lasers is used for forming the SiO$_2$ masks.

Subsequently, using these SiO$_2$ stripe masks, an n-InGaAsP guide layer 204 (the band-gap wavelength is 1.20 µm, the film thickness 150 nm, n=1×10$^{18}$ cm$^{-3}$) is formed between the mask region of W$_G$=15 µm by the selective MOVPE growth method under a lattice matching condition. The microscopic photoluminescence measurement of the band-gap wavelength of the selective grown guide layer clearly shows that the mask width dependence on the band-gap wavelengths has been reproduced as shown in FIG. 3.

Figure 31:
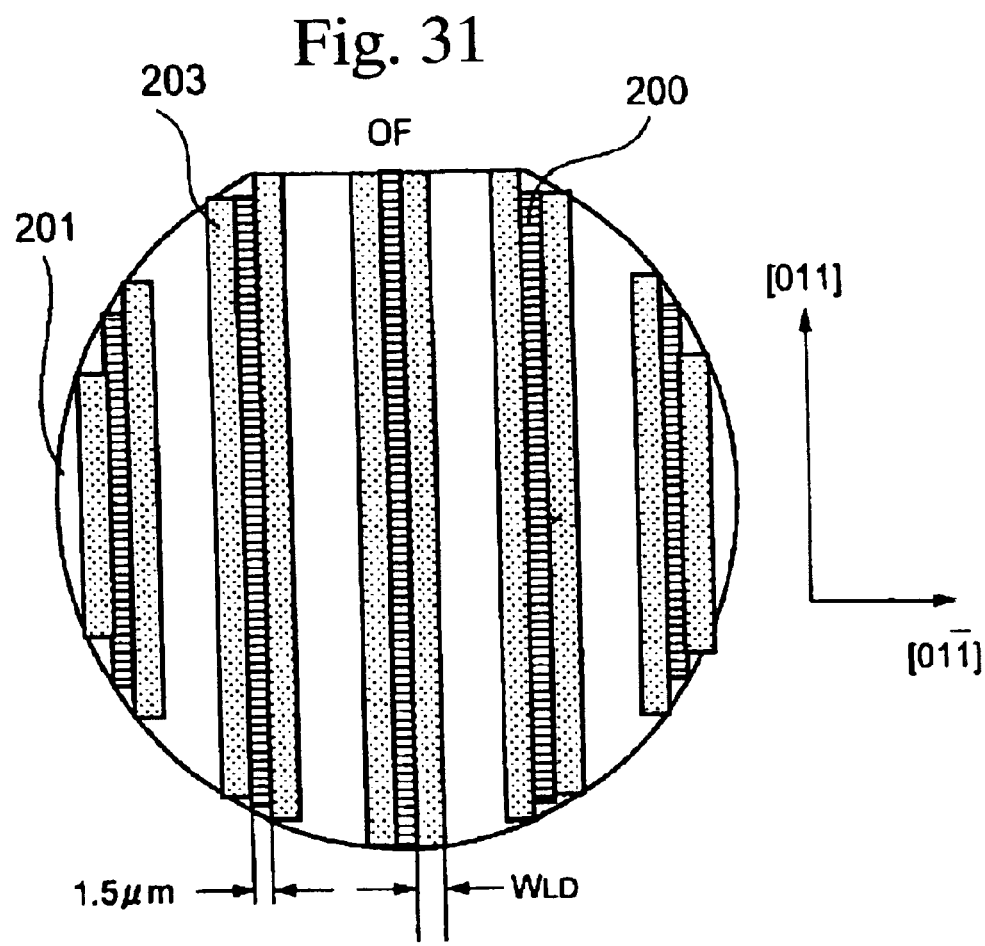
FIG. 31 is a plan view of the substrate surface explaining one embodiment of the present invention.

Subsequently, as shown in FIG. 31, a pair of SiO$_2$ stripe masks for growing the MQW active layer by the selective MOVPE growth method is formed by re-patterning so as to synchronize with the diffraction grating. Although not shown in FIG. 31, the n-Q1.20 guide layer is present in the aperture region of the SiO$_2$ stripes.

Figure 32:
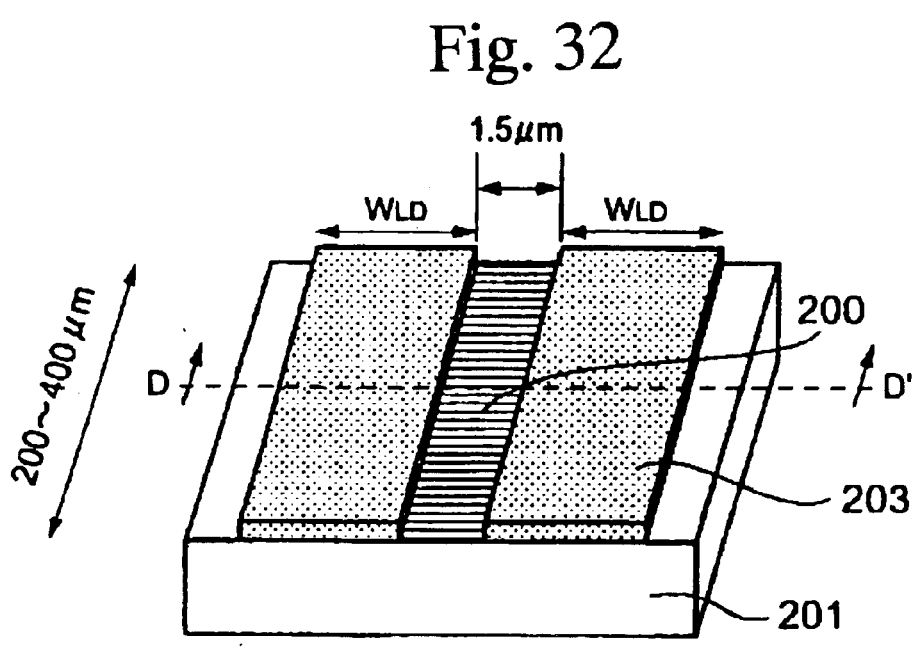
FIG. 32 is a perspective view explaining one embodiment of the present invention.

FIG. 32 illustrates a SiO$_2$ mask pattern for one element (the n-Q1.20 guide layer is not shown in this figure). The interval of the pair of stripe masks is fixed at 1.5 µm.

Although the pitches Λ and W$_G$ of the diffraction grating are shown continuously as lines in FIGS. 17 and 19, the pitches of the present embodiment are cut into 75 wavelengths by dividing the wavelength range of 1.52 µm to 1.58 µm into 75 steps with the interval of 100 GHz (approximately 0.8 nm), so that it is noted that the lines in FIGS. 17 and 19 are composed of 75 steps of discontinuous values.

Next, the selective MOVPE growth process is described with reference to FIG. 33, which is a cross-sectional view of the D-D' line shown in FIG. 32. The MOVPE growth is conducted under a condition such that the film is grown with a thickness distribution as shown in FIG. 7.

Figure 30:
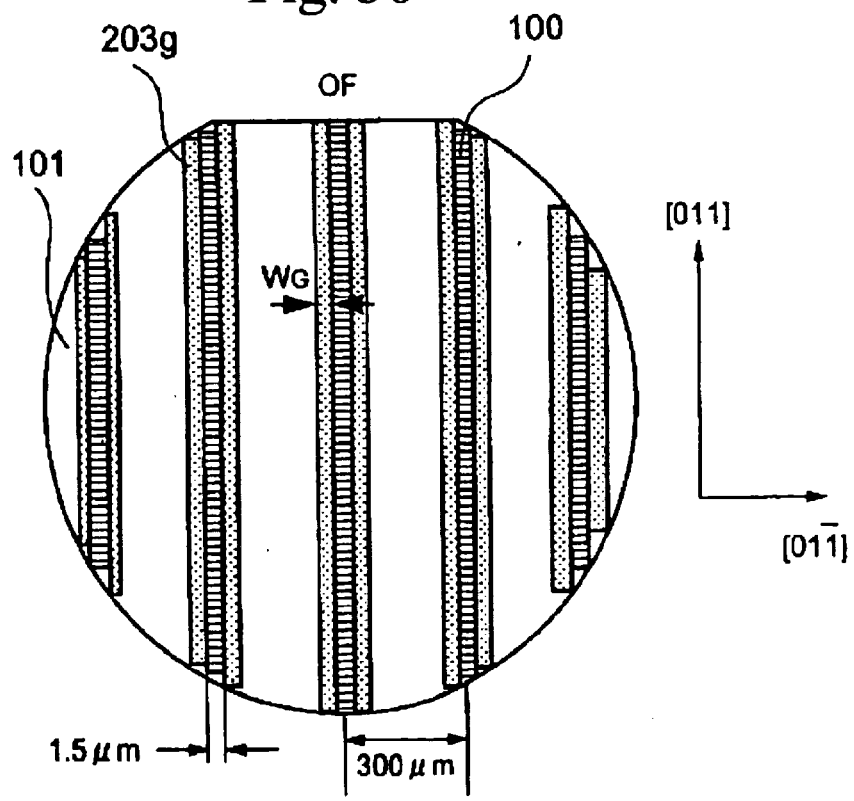
FIG. 30 is a plan view of the substrate surface explaining one embodiment of the present invention.

On the n-InGaAsP guide layer 204, explained in FIGS. 19 and 30, the strained MQW layer (five cycles of the well layer: InGaAsP (+0.60% strain, 10 nm in thickness) and the barrier layer: InGaAsP 205 (band-gap wavelength 1.20 µm, 9 µm in thickness)), and the p-InP layer 206 (150 nm in thickness, p=5×10$^{17}$ cm$^{-3}$), (these values are obtained when W$_{LD}$=15 µm) are grown by the selective MOVPE growth.

Figure 33D:
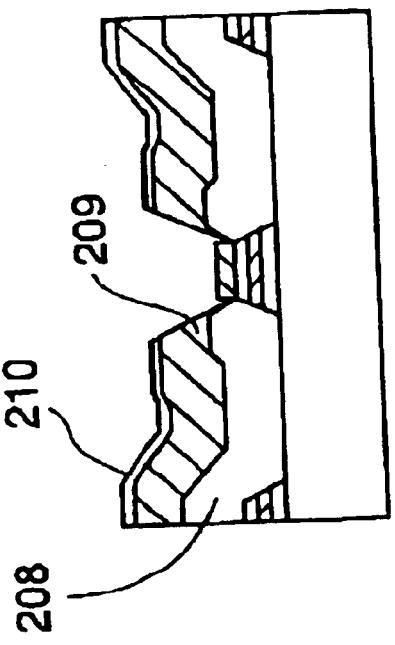
FIGS. 33A to 33E are cross-sectional views explaining the manufacturing processes according to one embodiment of the present invention.
Figure 33E:
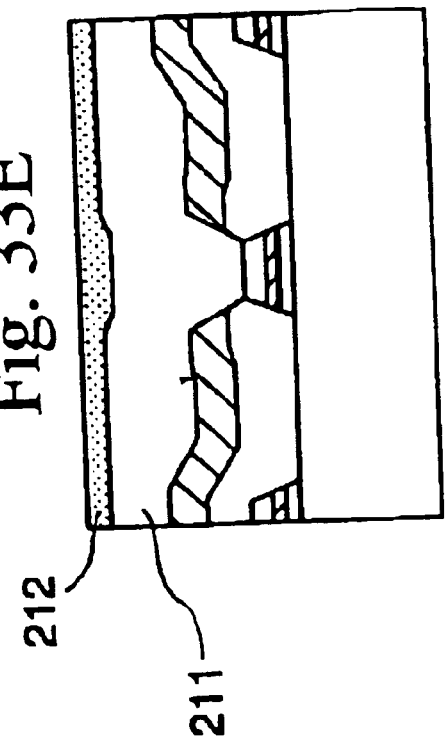
Figure 33A:
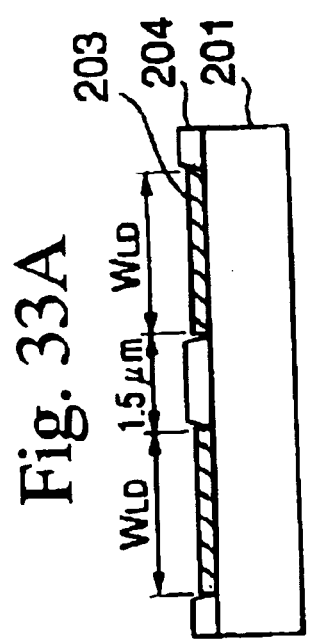
Figure 33B:
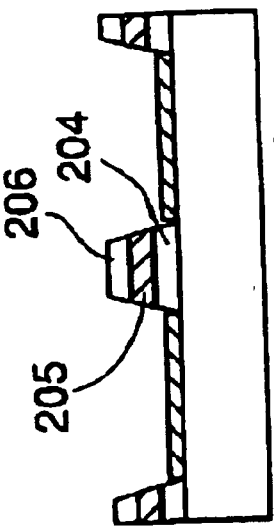
Figure 33C:
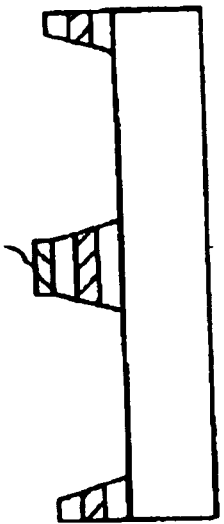

Subsequently, after forming SiO$_2$ mask 207 as shown in FIG. 33C on the above-described layer formed by the selective MOVPE method, a p-InP block layer 208, an n-InP block layer 209, and a p-InP layer 210 are selectively grown as shown in FIG. 33D. Finally, after removing the SiO$_2$ mask, a p-InP clad layer 211 and a p$^+$-InGaAs cap layer 212 are grown by the selective MOVPE growth method.

The processes shown in FIGS. 33B to 33E are disclosed in detail in a paper published in *IEEE Journal of Quantum Electronins*. Vol. 35, No. 3, pp. 368–367".

Figure 34:
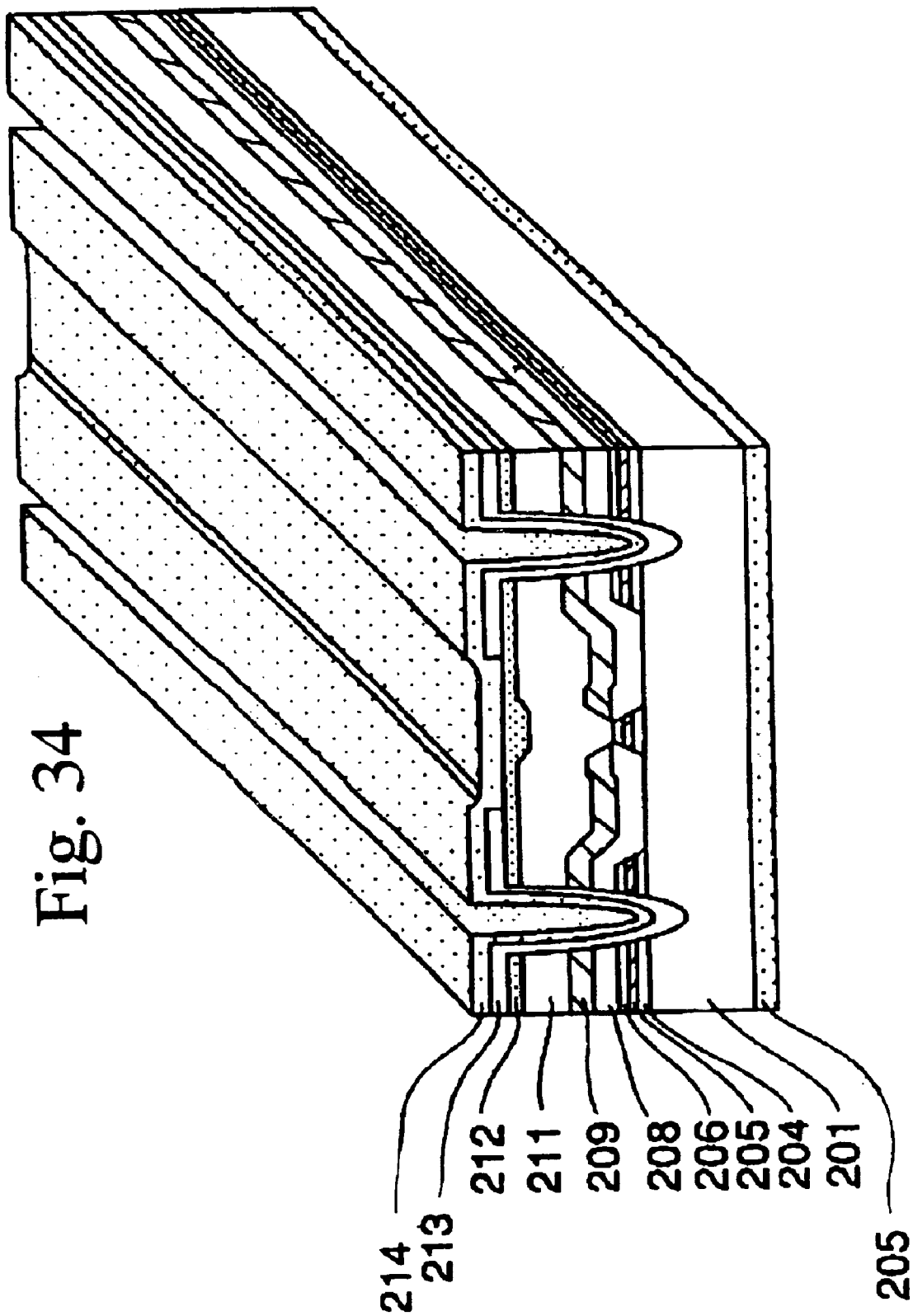
FIG. 34 is a perspective view showing the structure of one embodiment of the present invention.

Subsequently, as shown in FIG. 34, a p electrode 214 is formed by patterning using the SiO$_2$ film as an interlayer insulating film, and after back-grinding of the n-InP substrate 201 until obtaining a thickness of 100 µm, an n-type electrode 215 is formed on the back surface. After formation of the above structure, an element is obtained by cutting the substrate 210 into a length of 400 µm, and characteristics of the element are evaluated by coating a high reflectance film having a 95% reflectance on the one end facet of the DFB laser and coating a non-reflectance film having a reflectance of 0.1% on the other end facet.

Figure 26:
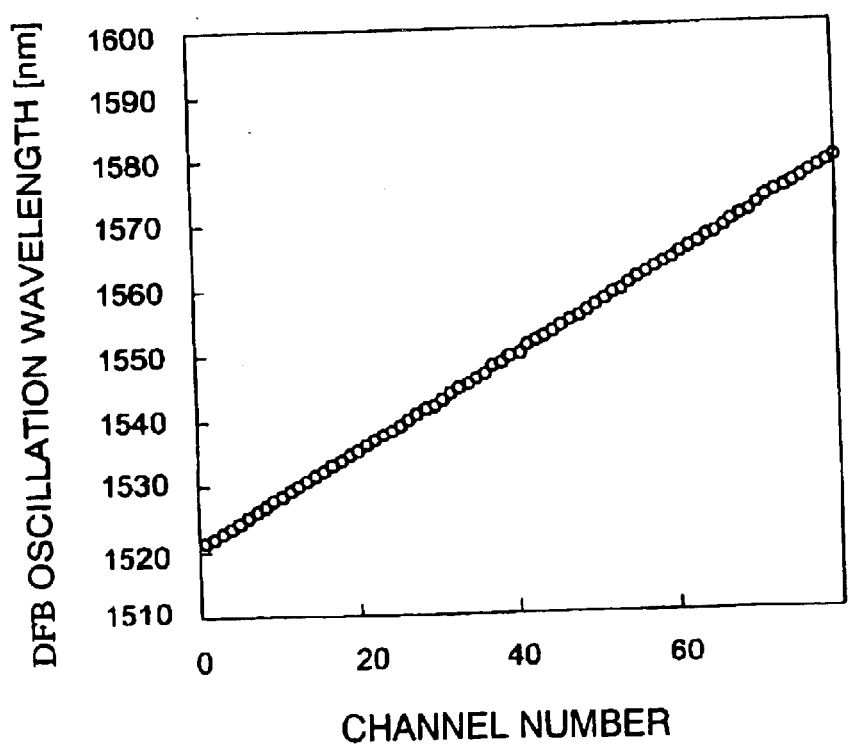
FIG. 26 is a characteristic diagram explaining one embodiment of the present invention.

First, the results of the evaluation of the oscillating wavelength characteristics of the different wavelength collectively formed DFB laser are described. The oscillating wavelengths of the DFB laser composed of 75 elements are shown in FIG. 26. The wavelengths of respective elements from channel 1 to channel 75 are shifted stepwise to longer wavelengths by a slope of 0.8 nm/channel, and it is confirmed that different wavelength elements are provided on one substrate covering a range of 1520 to 1580 nm (1.52 to 1.58 µm). The coupling coefficient κ of these laser elements are examined.

Figure 35:
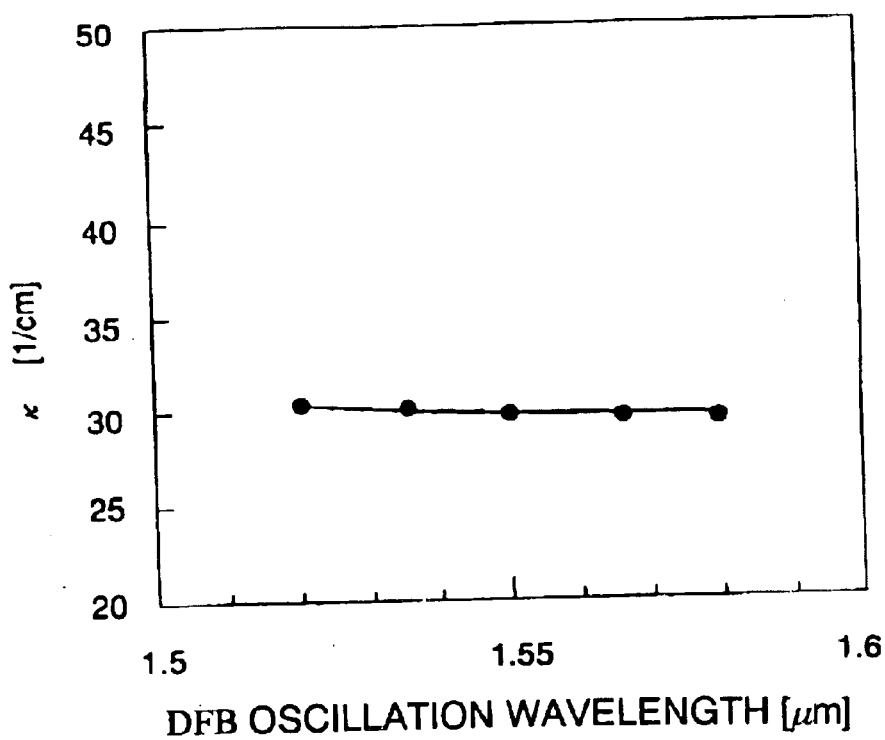
FIG. 35 is a characteristic diagram explaining one embodiment of the present invention.
Figure 36:
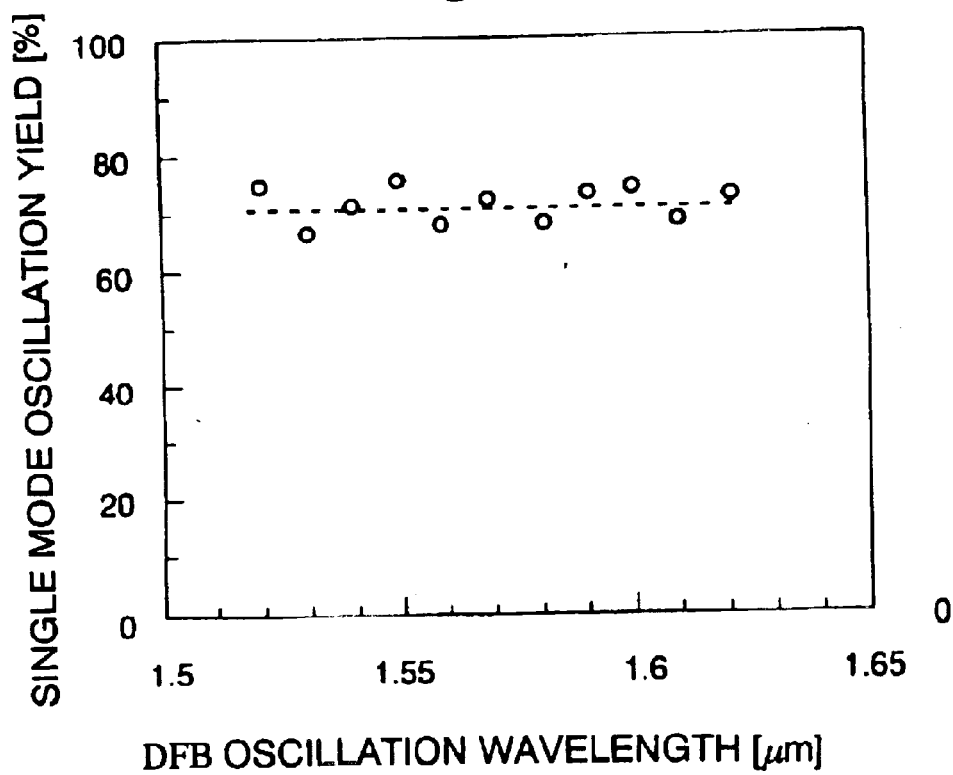
FIG. 36 is a characteristic diagram explaining one embodiment of the present invention.

It was confirmed as shown in FIG. 35 that the coupling coefficients κ for these laser elements are maintained at an approximately constant value of 30.0 cm$^{-1}$. The stable oscillating wavelength dependency of the coupling coefficients κ for the present laser elements is obtained as a result of the present invention in which the band-gap wavelengths of the InGaAsP guide layer are varied corresponding to the oscillating wavelength in contrast to the conventional coupling coefficients κ with the oscillating wavelength.

Consequently, a most preferable results were obtained in that the highly homogeneous characteristics such as the laser oscillating threshold value 5.0±0.25 mA, the efficiency 0.35±0.05 W/A, and the maximum light output 160±3 mW are resulted, and the longitudinal single mode yield is more than 65% irrespective of the oscillating wavelength.

Next, a collective manufacturing method according to the third embodiment of the present invention is described for manufacturing a different wavelength EA modulater integrated DFB laser differing from the first embodiment.

As shown in FIG. 15, an electron beam sensitive positive resist 102 is coated on the (100) n-InP substrate 101, and the pattern shown in FIG. 15A is formed. Subsequently, the diffraction grating shown in FIG. 15A is formed by etching the n-InP substrate 101 using an etching solution in the system of HBr:H$_2$O using of the resist 102 as the mask. The diffraction grating is formed as a pattern in which a diffraction grating formation region with a length of 800 μm in the [011] direction and a non-diffraction grating formation region with a length of 400 μm are repeatedly formed in the [01–1] direction. In order to provide an EA modulator integrated DFB laser, the pitch Λ of the diffraction grating is set within a range of 235.05 to 244.30 nm which can yield oscillating wavelengths ranging from 1.52 to 1.58 μm. The arrangement of this different pitch in the diffraction grating is explained with reference to FIGS. 37 and 38.

Figure 37:
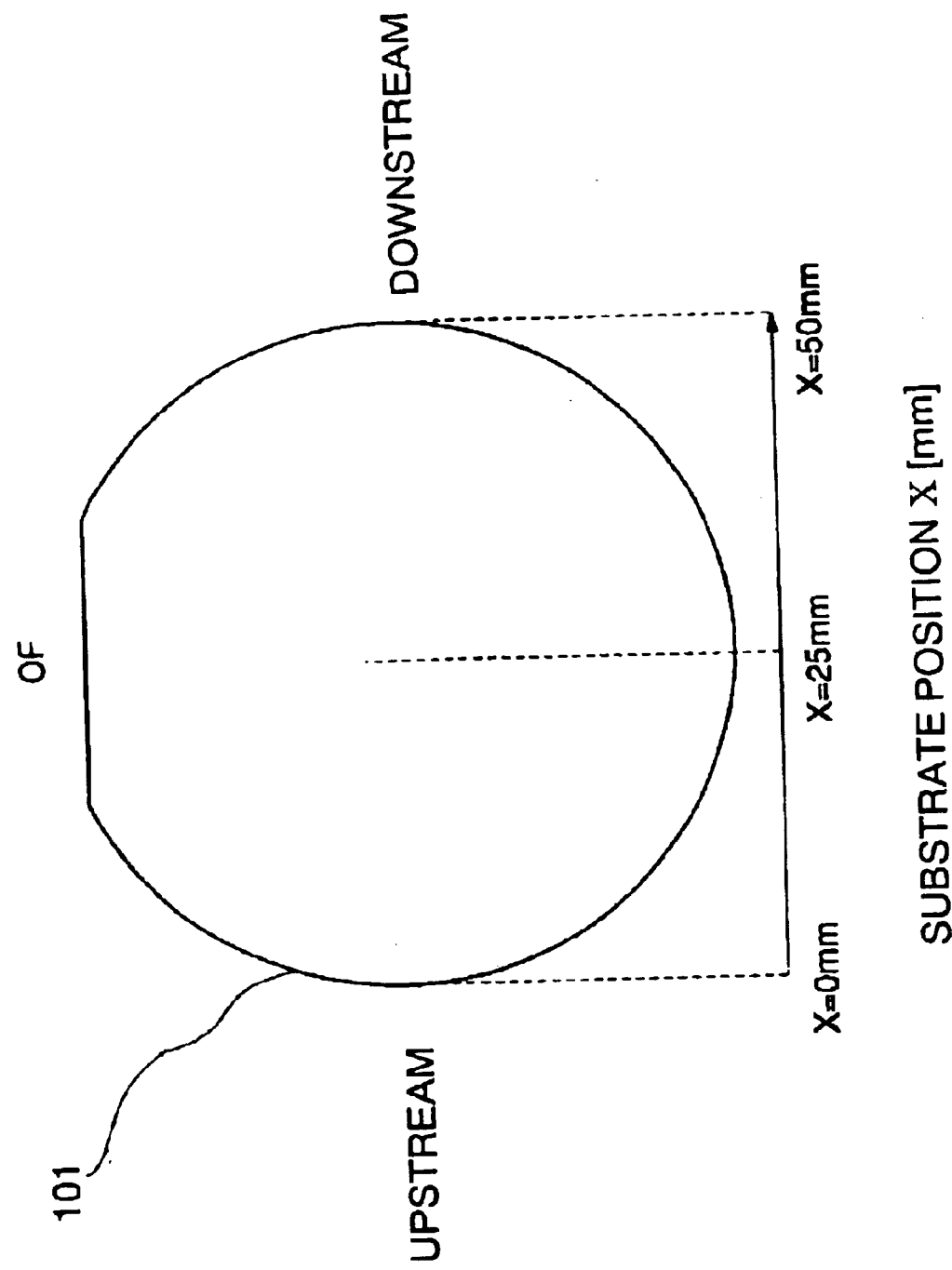
FIG. 37 is a plan view showing the substrate surface explaining one embodiment of the present invention.
Figure 38:
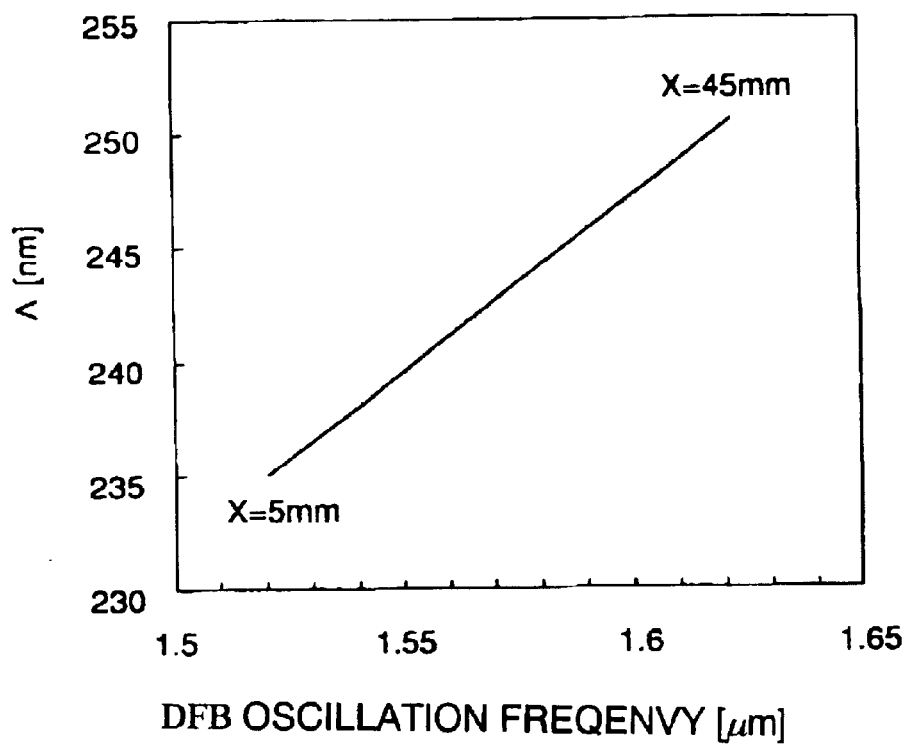
FIG. 38 is a design characteristic diagram explaining one embodiment of the present invention.

The position coordinate of the 2 inch InP substrate is defined in FIG. 37. In the figure, the left end of the substrate is defined as X=0 mm, the right end of the substrate is defined as X=50 mm, and the center of the substrate is defined as X=25 mm. Based on this definition, the pitches of the diffraction grating on the substrate are one-dimensionally disposed such that 235.05 nm at X=5 mm and 244.30 nm at 45 mm are obtained. Subsequently, this substrate with the diffraction grating is introduced into the double fluid layer-type MOVPE growth apparatus for growing an n-InGaAsP guide layer (the band-gap wavelength is 1.25 μm, the thickness is 150 nm, n=1×10$^{18}$ cm$^{-3}$) on the entire substrate surface. In the growing process, the substrate end at X=0 is disposed upstream and the substrate end at X=50 mm is disposed downstream for the flow of the material gas. The AsH$_3$ partial flow ratio is set at 85%.

Figure 39:
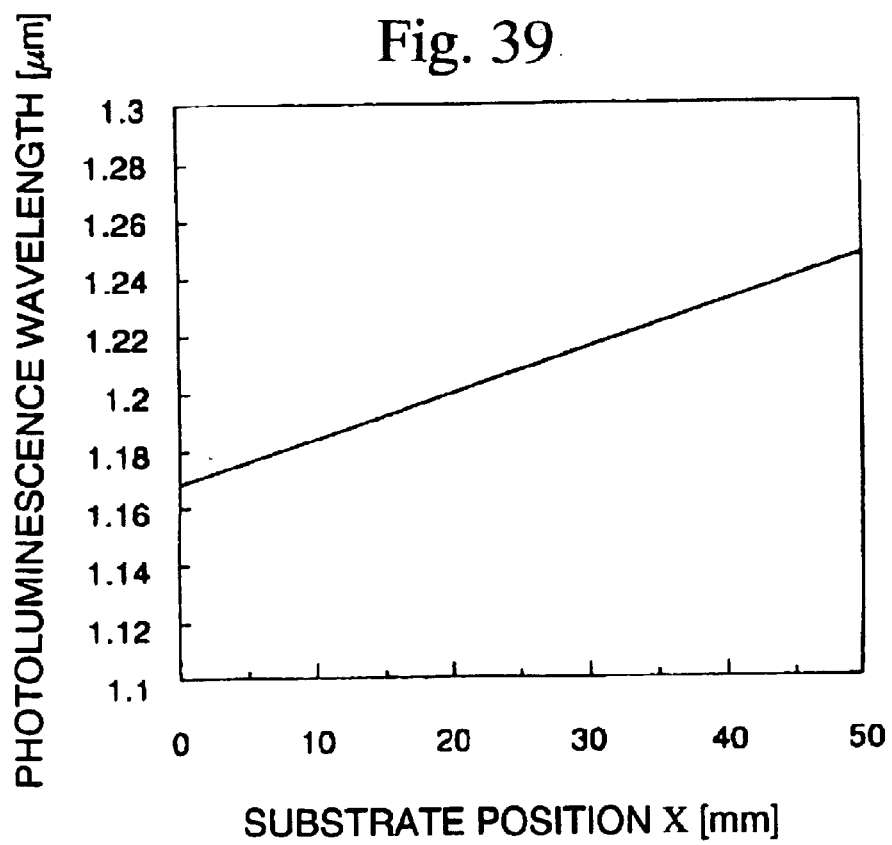
FIG. 39 is a characteristic diagram explaining one embodiment of the present invention.

FIG. 39 shows the substrate position dependence of the photoluminescence wavelength formed by the above-described two layer-type MOVPE growth. The wavelength becomes longer linearly as the position shifts from 1.17 μm at X=0 mm to 1.25 μm at X=50 mm. Subsequently, a pair of SiO$_2$ stripe masks for the selective MOVPE growth is re-patterned as shown in FIG. 20 so as to synchronize with the diffraction grating 100. The mask width is set at W$_{LD}$ in the region where the diffraction grating is formed, and the mask width is set at W$_{MOD}$ in the region where the diffraction grating is not formed.

Although not shown in FIG. 20, the n-Q1.25 guide layer is formed on the entire substrate surface. FIG. 21 shows the SiO$_2$ stripe mask pattern for one element (the n-Q1.25 guide layer is also not shown in FIG. 21). That is, the area (400 μm in length) where the mask width is formed at W$_{LD}$ is the region for forming the DFB laser, and the area (200 μm length) where the mask width is formed at W$_{MOD}$ is the region for forming the EA modulator.

Figure 40:
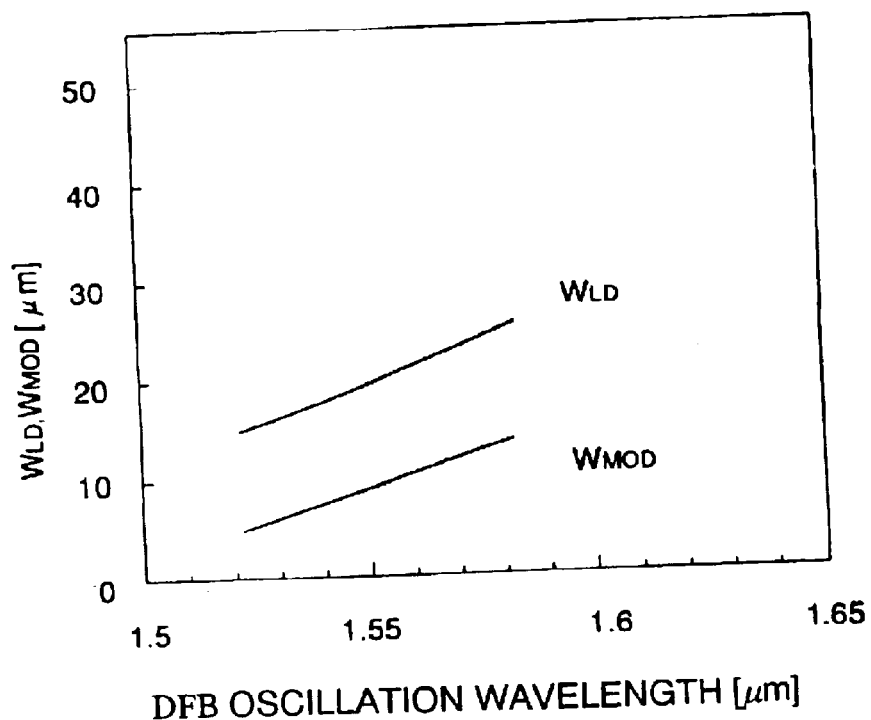
FIG. 40 is a design characteristic diagram explaining one embodiment of the present invention.

The width of a pair of stripe masks is fixed at 1.5 μm. The widths of W$_{LD}$ and W$_{MOD}$ are varied corresponding to the DFB oscillating wavelength as shown in FIG. 40. Although the relationship between the pitches Λ including W$_{LD}$ and W$_{MOD}$ of the diffraction grating and the DFB oscillating wavelength are depicted as two straight lines, it is noted that these lines consist of 75 discontinuous values corresponding to the design values obtained by dividing the DFB oscillating wavelength range of 1.52 to 1.58 μm by 100 GHz (approximately 0.8 nm intervals).

Subsequently, on the substrate 104 on which the SiO$_2$ pattern is formed, a MQW laser active layer and a modulator absorption layer are formed using the selective MOVPE growth method. On the n-InGaAsP guide layer 104, eight cycles of the strained MQW layer 105 (eight cycles of the well layer: InGaAsP (+0.6% compressively strained, 10 μm in thickness) and the barrier layer of InGaAsP (the band-gap wavelength 1.20 μm, 9 nm in thickness)), and p-InP layer 106 (50 nm thick, p=5×10$^{17}$ cm$^{-3}$) are formed (all values are obtained when the width W$_{LD}$=15 μm). As a result, the photoluminescence wavelengths in the range of 1.52 to 1.58 μm and in the range of 1.45 to 1.51 μm are reproduced for respective widths of W$_{LD}$ and W$_{MOD}$ as shown in FIG. 4.

Figure 41:
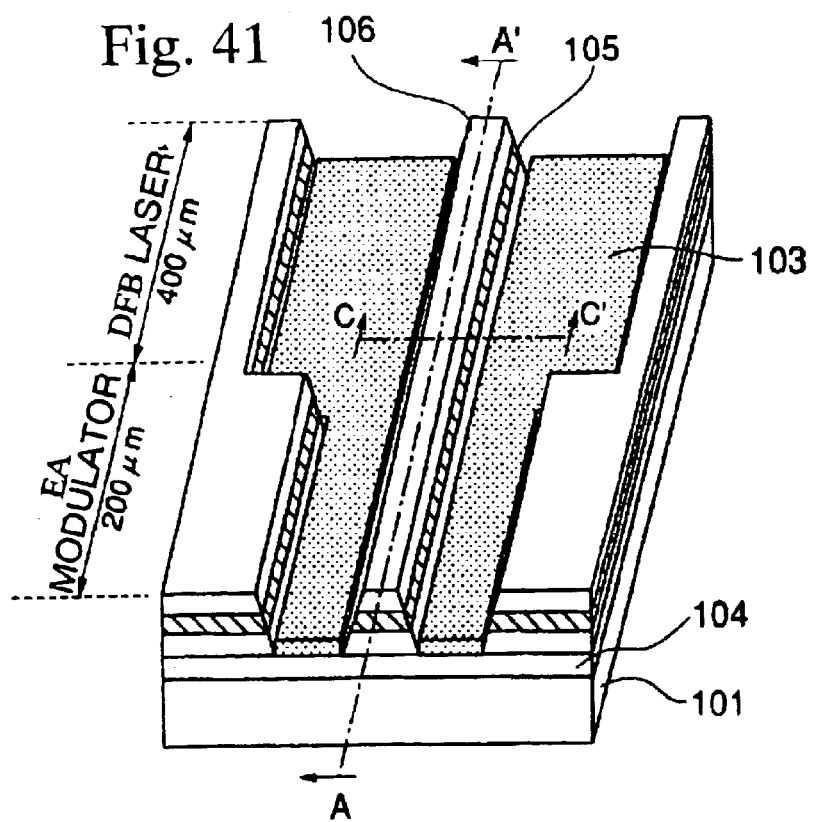
FIG. 41 is a perspective view explaining one embodiment of the present invention.

As shown in FIG. 23, illustrating a cross-sectional view of the A-A'line in FIG. 41, the diffraction grating exists in the DFB laser region. The bandgap wavelength of the guide layer 104 changes from 1.17 μm to 1.25 μm as designed. Thus, the coupling coefficient κ is expected to be maintained at a fixed value of 37.5 cm$^{-1}$.

Figure 42A:
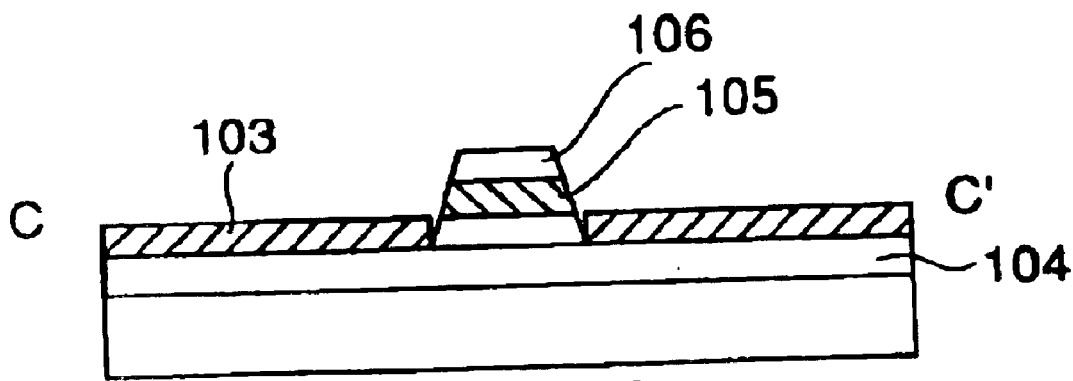
FIGS. 42A to 42C are cross-sectional views along the C-C' line in FIG. 41 for explaining one embodiment of the present invention.
Figure 42B:
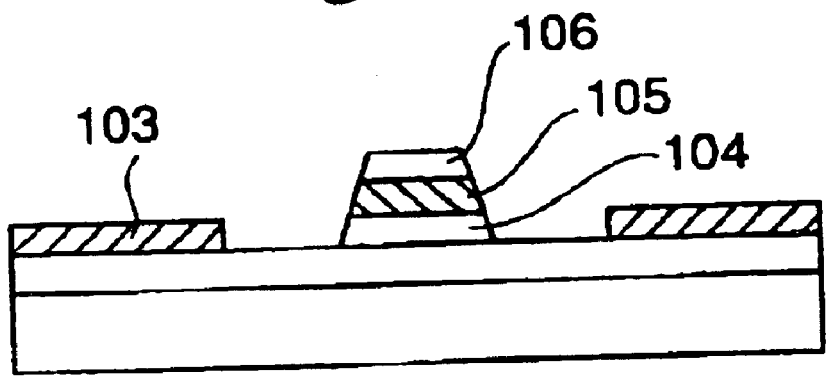
Figure 42C:
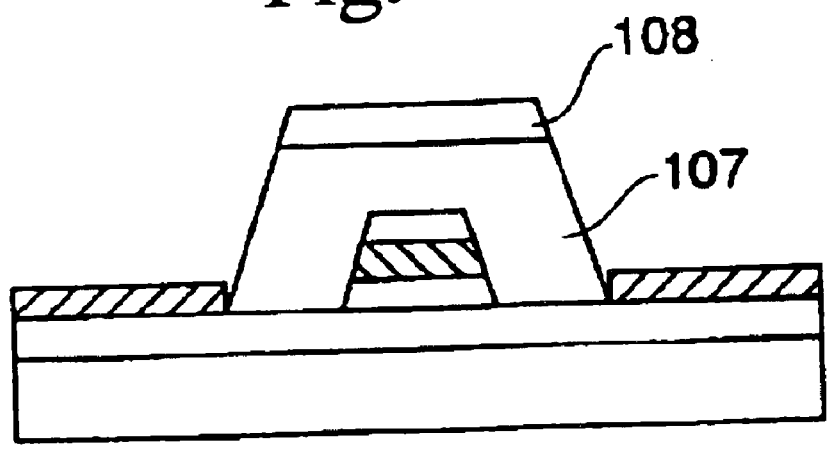
Figure 43:
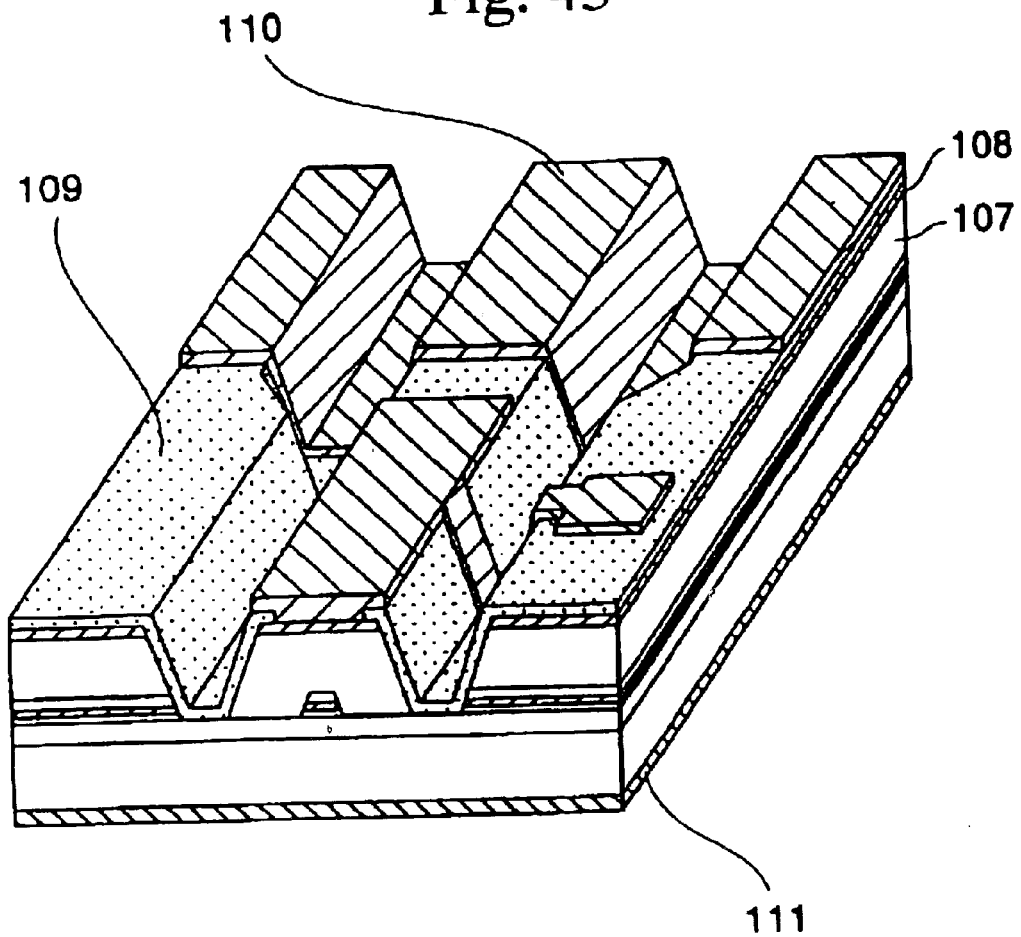
FIG. 43 is a perspective view explaining one embodiment of the present invention.

As shown in FIG. 42, which is a cross-sectional view along the C-C' line shown in FIG. 41, both side portions of the SiO$_2$ layer located at both sides of the selective growth layer are removed (FIG. 42B), and after forming a p-InP clad layer 107 (1.5 μm in thickness and p=1×10$^{18}$ cm$^3$) and a P$^+$-InGaAs cap layer 108 (0.25 μm in thickness, p=6×10$^{18}$ cm$^{-3}$) by the selective MOPVE growth as shown in FIG. 42C, electrical separation is performed by removing the p$^+$-InGaAs cap layer 108 with a width of 30 μm between the DFB laser region and the EA modulator region. As shown in FIG. 43, a p-type electrode 110 is formed by patterning using the SiO$_2$ film 109 as the interlayer insulating film, and an n-type electrode 111 is formed after back grinding is carried out until the thickness of the n-InP substrate is reduced to 120 μm. A total length of 600 μm of the thus formed substrate including the DFB laser portion of 400 μm in length and the EA modulator portion of 200 μm in length, is cut into elements. Each element is subjected to the evaluation of the device characteristics after coating a high reflection film with a reflectance of 95% at the end facet of the DFB laser portion and after coating an anti-reflection film with less than 0.1% reflectance at the end facet face of the modulator.

First, the oscillating wavelength characteristics of this different wavelength collectively formed EA modulator integrated DFB laser are examined. The DFB laser oscillating wavelengths of the 75 thus produced elements are plotted in FIG. 26 in sequence. It is confirmed that the wavelengths of these elements from channel 1 to channel 75 are shifted to longer wavelengths from one to the next channel by 0.8 nm as designed and multiple wavelength laser elements covering the wavelength range of 1520 to 1580 nm (1.52 to 1.58 μm) are provided on one substrate surface.

Next, the coupling coefficients κ for some elements having different wavelengths are evaluated. Consequently, it has been confirmed as shown in FIG. 27 that the coupling coefficient is maintained approximately at the designed value of 37.5 cm$^{-1}$ irrespective of the change of the oscillating wavelength. This result is obtained by utilizing the effect of the present invention that the band-gap wavelengths of the InGaAsP guide layers for respective elements on the diffraction grating are changed corresponding to the oscillating wavelengths of the elements.

As the result, as shown in FIG. 28, the transmission yield, obtained by use of a standard that the power penalty after the 2.5 Gb/s transmission over 600 km is less than 1 dB, is more than 95% in all wavelength ranges, while the single longitudinal mode oscillation yield is maintained to more than 60% irrespective of the oscillation wavelength.

In the above embodiment, although examples are described in which the diffraction grating, the guide layer, and the active layer are formed in sequence, it is noted that this invention is not limited to these embodiments and the present invention can be applied to a modified structure in which the guide layer and the diffraction grating can be formed on the active layer.

Figure 44:
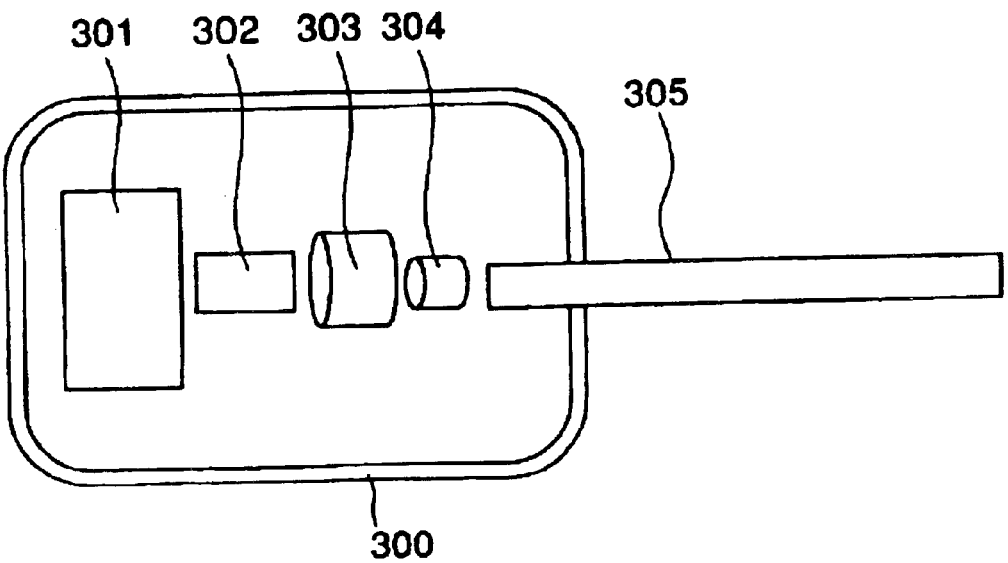
FIG. 44 is a diagram showing the structure of an optical communication module for explaining an application example of the present invention.

As an application example of this invention, a light communication module provided with an optical semiconductor device is described with reference to FIG. 44. This module, loaded with an electric interface 301 for driving the optical semiconductor device 302, is constituted such that the output light from the optical semiconductor device 302 is input into the optical fiber 305 through an aspherical lens and an optical isolator. This module, constituted as described above, makes it possible to effectively execute high speed optical transmission. This effect is obtained through the low threshold value and highly efficient operating characteristics of the optical semiconductor device of the present invention.

Figure 45:
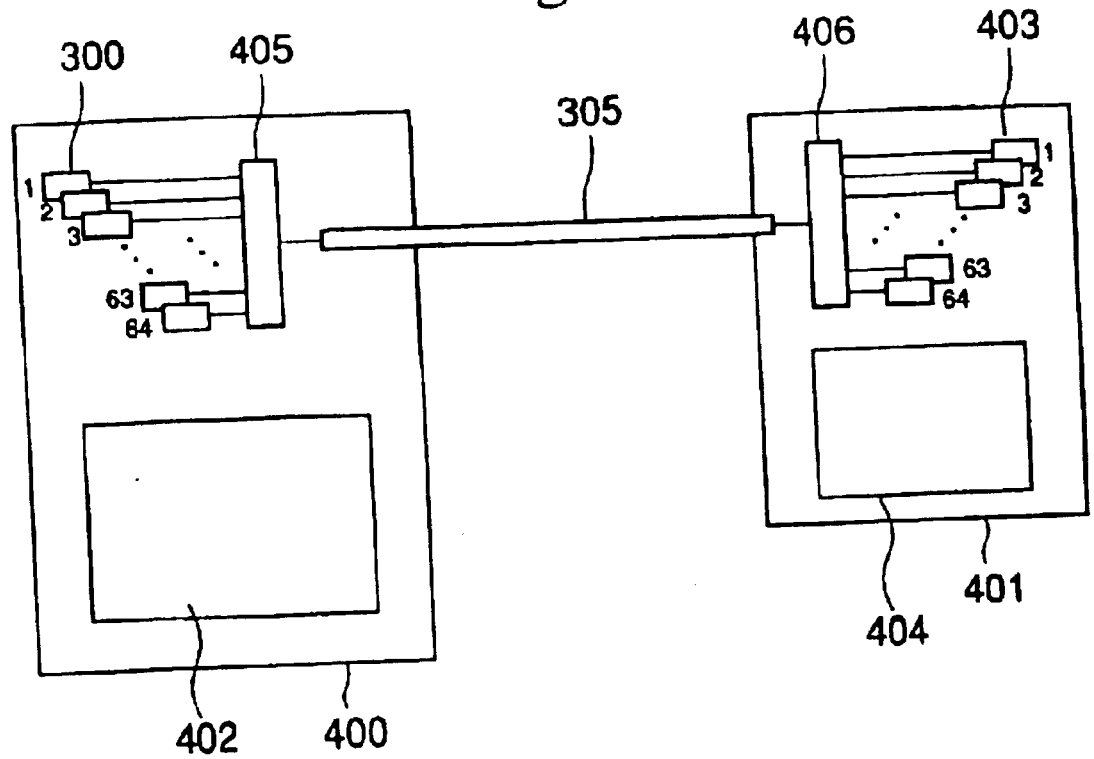
FIG. 45 is a diagram showing an example of the optical communication system for explaining an application example of the present invention.
Figure 46:
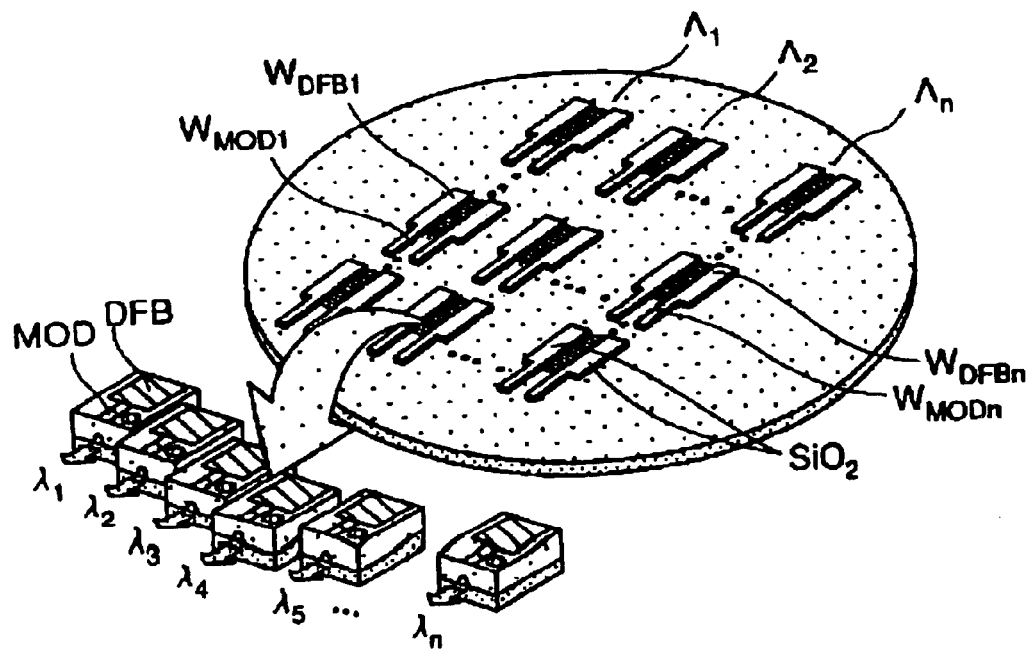
FIG. 46 is a perspective view showing an example of the collective formation of a conventional different wavelength element.

As another application example, a WDM optical communication system provided with the optical semiconductor device of the present invention is described with reference to FIG. 45. The optical communication apparatus 400 comprises 64 optical communication modules 300, a multiplexer 405 for multiplexing multiple lights from these light emitting elements in the optical communication module 300, and a driving system 402 for driving the light transmission module. A signal light output from the optical communication apparatus 400 is transmitted to the optical receiving apparatus 401 through the optical fiber 305. The light having 64 wavelengths which is received by the optical receiving apparatus is divided into 64 light signals by the optical demultiplexer 406 and each divided light signal is input into each of 64 light receiving modules 403, driven by the receiving module driving system 404. The WDM communication system is realized by the optical communication system of the present invention. This is due to the fact that the optical semiconductor device has quite homogeneous characteristics irrespective of the variation of the wavelengths.

The optical semiconductor device and method for manufacturing the same according to the present invention is constituted as described above. The manufacturing method for collectively manufacturing the multiple wavelength DFB laser or the multiple wavelength EA modulator integrated DFB laser is capable of maintaining the coupling coefficients κ of respective elements by controlling the refractive index (the band-gap wavelength) of the guide layer corresponding to the dielectric material mask width or the location on the substrate. Thereby, it becomes possible to maintain the coupling coefficient κ or the product κL of the coupling coefficient and the length of the DFB laser resonator, which results in an improvement in the long distance transmission yield or the longitudinal single mode oscillation yield.

What is claimed is:

1. A manufacturing method for collectively manufacturing, on a single substrate, an optical semiconductor device comprising a plurality of semiconductor lasers which emit longitudinal single mode laser lights having different wavelengths due to a distribution feedback operation of a periodic change of the refractive indexes in the respective semiconductor lasers, said method comprising:

forming at least one overlying semiconductor layer during manufacture so that the refractive indexes of diffraction grating embedded semiconductor layers are decreased (or increased) so as to cancel a difference of coupling coefficients of respective semiconductor lasers whose coupling coefficients are increased (or decreased) when diffraction gratings for generating a distribution feedback operation are formed in a same configuration and the refractive indexes of said diffraction grating embedded semiconductor layers are fixed at a same value, said forming including canceling said difference of coupling coefficients thereby providing at least one diffraction grating embedded semiconductor layer that has been adjusted to provide a substantially constant coupling coefficient for all of said plurality of semiconductor lasers on said optical semiconductor device.

2. A manufacturing method for collectively manufacturing, on a single substrate, an optical semiconductor integrated device comprising a plurality of semiconductor lasers which emit longitudinal single mode laser lights having different wavelengths due to a distributed feedback operation of a periodic change of refractive indexes in the respective semiconductor lasers, and a plurality of optical semiconductor portions integrally formed with said semiconductor lasers for receiving the respective laser lights from said plurality of semiconductor lasers, said method comprising:

forming at least one overlying semiconductor layer during manufacture so that the refractive indexes of said diffraction grating embedded semiconductor layers are decreased (or increased) so as to cancel a difference of coupling coefficients of respective semiconductor lasers for the semiconductor lasers whose coupling coefficient is increased (or decreased) when the diffraction gratings for generating a distributed feedback operation are formed in a same configuration and the refractive indexes of the diffraction grating embedded semiconductor layers are fixed at a same value, said forming including canceling said difference of coupling coefficients thereby providing at least one diffraction grating embedded semiconductor layer that results in a substantially constant coupling coefficient for all of said plurality of semiconductor lasers on said optical semiconductor.

3. A manufacturing method according to claim 2, wherein said optical semiconductor integrated device comprises a plurality of longitudinal single mode oscillating semiconductor lasers and optical modulators.

4. A manufacturing method according to claim 1, wherein said forming comprises a process that adjusts band-gap wavelengths of said diffraction grating embedded semiconductor layers so that said band-gap wavelengths are made shorter (or longer) so as to cancel the difference of the coupling coefficients of the respective semiconductor lasers for the semiconductor lasers whose coupling coefficients are increased (or decreased) when the diffraction gratings for generating a distributed feedback operation are formed in the same configuration and the band-gap wavelengths of said diffraction grating embedded semiconductor layers are fixed at the same value.

5. A manufacturing method according to claim 4, wherein at least one of said diffraction grating embedded semiconductor layers comprises InGaAsP, and the change of the refractive index of said InGaAsP layer is acheived by changing the compositional ratio of In and Ga in Group III in the periodic table.

6. A manufacturing method according to claim 4, wherein at least one of said diffraction grating embedded semiconductor layers comprises InGaAsP, and the change of the band-gap wavelength is achieved by changing the compositional ratio of As and P belonging to Group V of the periodic table.

7. A manufacturing method according to claim 1, wherein said forming comprises changing the refractive index or the band-gap wavelength of said diffraction grating embedded semiconductor layer by using selective metal organic vapor phase growth method.

8. A manufacturing method according to claim 1, wherein the method for changing the refractive index or the band-gap wavelength of said diffraction grating embedded semiconductor layer comprises adjusting a flowing ratio of Group V materials in an atmospheric pressure double fluid layer type metal organic vapor phase growth method.

9. An optical semiconductor device obtained by the manufacturing method according to claim 8, which is applied to an optical communication module, wherein the optical communication module comprises:

a waveguide device for guiding an output light from said optical semiconductor device to the outside, a mechanism for inputting the output light from said semiconductor device to the waveguide device, and an electrical interface for driving said semiconductor device.

10. An optical semiconductor device according to claim 9, applied to an optical communication module, wherein the optical communication module comprises:

a waveguide device for guiding an output light from said optical semiconductor device to the outside, a mechanism for inputting the output light from said semiconductor device to the waveguide device, and an electrical interface for driving said semiconductor device.

11. A method of manufacturing, on a single substrate, an optical semiconductor device comprising a plurality of semiconductor optical devices having different wavelengths due to a distribution feedback operation of a periodic change of refractive indexes in the respective semiconductor optical devices, said method comprising:

providing a pattern of diffraction gratings on said substrate, at least one of a pitch and a width of said diffraction gratings having a relationship with predetermined oscillating frequencies to provide said different wavelengths; and providing at least one semiconductor layer on said pattern of diffraction gratings to provide at least one of a laser active layer, a light absorbing layer, and a guide layer, at least one of said at least one semiconductor layer being formed during manufacture to adjust a parameter that compensates for a change in a coupling coefficient of said at least one semiconductor layer that would occur due to changes in at least one of said pitch and said width of said diffraction gratings in said pattern if a refractive index of said at least one semiconductor layer were to be fixed at a same value, said parameter adjustment thereby suppressing a dispersion of a coupling coefficient across said optical semiconductor device by providing a coupling coefficient that is substantially constant irrespective of the different oscillating frequencies.

12. The method of claim 11, wherein at least one of said at least one semiconductor layer is formed by a metalorganic vapor phase epitaxy (MOVPE) growth method.

13. The method of claim 11, wherein said substrate comprises an InP substrate, said plurality of semiconductor devices comprise semiconductor lasers, said at least one semiconductor layer comprises a multi-quantum well layer, an InGaAsP guide layer, and an InP clad layer, and said parameter comprises a compositional ratio of As and P.

14. The method of claim 11, wherein said substrate comprises an InP substrate, said plurality of semiconductor devices comprise semiconductor lasers, said at least one semiconductor layer comprises a multi-quantum well layer, an InGaAsP guide layer, and an InP clad layer, and said parameter comprises a compositional ratio of In and Ga.

15. The method of claim 11, wherein said diffraction grating, said guide layer, and said active layer are formed in sequence on said substrate.

16. The method of claim 11, wherein said guide layer and said diffraction grating are formed on said active layer.

17. The method of claim 12, wherein said parameter comprises an adjustment of a flowing ratio of group V group materials in an atmospheric pressure double-fluid layer type MOVPE method.

18. The method of claim 12, wherein said parameter comprises a thickness of said at least one semiconductor layer, said thickness being varied as a result of adjusting an amount of carrier gas relative to an optimum amount for growing a homogeneous film thickness.

19. The method of claim 12, wherein said parameter comprises a compositional ratio of said at least one semiconductor layer, said compositional ratio being varied as a result of adjusting a flow rate of a gas at an upper inlet relative to a flow rate at a lower inlet.

* * * * *